(12) United States Patent
Sato et al.

(10) Patent No.: US 12,159,928 B2
(45) Date of Patent: Dec. 3, 2024

(54) SEMICONDUCTOR DEVICE

(71) Applicant: FUJI ELECTRIC CO., LTD., Kanagawa (JP)

(72) Inventors: Shigeki Sato, Matsumoto (JP); Ryu Araki, Matsumoto (JP); Hiroshi Miyata, Matsumoto (JP); Soichi Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 586 days.

(21) Appl. No.: 17/409,816

(22) Filed: Aug. 24, 2021

(65) Prior Publication Data

US 2021/0384331 A1    Dec. 9, 2021

Related U.S. Application Data

(63) Continuation of application No. PCT/JP2020/032956, filed on Aug. 31, 2020.

(30) Foreign Application Priority Data

Sep. 25, 2019 (JP) .................. 2019-174437

(51) Int. Cl.
 *H01L 29/739* (2006.01)
 *G01R 31/26* (2020.01)
 (Continued)

(52) U.S. Cl.
 CPC ...... *H01L 29/7396* (2013.01); *G01R 31/2619* (2013.01); *H01L 27/0255* (2013.01);
 (Continued)

(58) Field of Classification Search
 CPC ............. H01L 29/7396; H01L 29/0607; H01L 29/0623; H01L 29/0696; H01L 29/866;
 (Continued)

(56) References Cited

U.S. PATENT DOCUMENTS

| 5,500,547 A | 3/1996 | Yamaguchi |
| 9,024,412 B2 | 5/2015 | Tonomura |

(Continued)

FOREIGN PATENT DOCUMENTS

| CN | 101677096 A | 3/2010 |
| CN | 103400818 A | 11/2013 |

(Continued)

OTHER PUBLICATIONS (ISA/237) Written Opinion of the International Search Authority for International Patent Application No. PCT/JP2020/032956, issued/mailed by the Japan Patent Office on Nov. 24, 2020.

(Continued)

*Primary Examiner* — Sitaramarao S Yechuri

(57) ABSTRACT

A semiconductor device including: a semiconductor substrate; a temperature sensing unit provided on a front surface of the semiconductor substrate; an anode pad and a cathode pad electrically connected with the temperature sensing unit; a front surface electrode being set to a predetermined reference potential; and a bidirectional diode unit electrically connected in a serial bidirectional way between the cathode pad and the front surface electrode is provided. The bidirectional diode unit may be arranged between the anode pad and the cathode pad on the front surface.

20 Claims, 20 Drawing Sheets

(51) Int. Cl.
*H01L 27/02* (2006.01)
*H01L 29/06* (2006.01)
*H01L 29/866* (2006.01)

(52) U.S. Cl.
CPC ...... *H01L 29/0607* (2013.01); *H01L 29/0623* (2013.01); *H01L 29/0696* (2013.01); *H01L 29/866* (2013.01)

(58) Field of Classification Search
CPC . H01L 29/861; H01L 29/407; H01L 29/4238; H01L 29/8613; H01L 29/0834; H01L 29/7397; H01L 27/0255; H01L 27/0248; H01L 27/0629; H01L 27/0727; H01L 23/34; H01L 23/60; H01L 22/34; G01R 31/2619
See application file for complete search history.

(56) References Cited

U.S. PATENT DOCUMENTS

| | | | |
|---|---|---|---|
| 9,461,030 B2 | 10/2016 | Nishimura | |
| 10,290,625 B2 | 5/2019 | Sato | |
| 2005/0156267 A1 | 7/2005 | Mori | |
| 2005/0274982 A1 | 12/2005 | Ueda | |
| 2007/0132069 A1* | 6/2007 | Lee | H01L 29/407 257/659 |
| 2008/0117557 A1 | 5/2008 | Mamitsu | |
| 2009/0066404 A1* | 3/2009 | Heppenstall | G01K 7/01 257/E29.001 |
| 2010/0072604 A1 | 3/2010 | Komatsu | |
| 2014/0070319 A1 | 3/2014 | Tonomura | |
| 2015/0001579 A1 | 1/2015 | Nishimura | |
| 2015/0378376 A1 | 12/2015 | Matsui | |
| 2016/0163656 A1 | 6/2016 | Sugiura | |
| 2016/0163689 A1 | 6/2016 | Laven | |
| 2017/0062336 A1 | 3/2017 | Takahashi | |
| 2017/0236908 A1 | 8/2017 | Naito | |
| 2018/0190642 A1 | 7/2018 | Okuda | |
| 2019/0273488 A1 | 9/2019 | Reiter | |
| 2020/0144149 A1 | 5/2020 | Kubouchi | |

FOREIGN PATENT DOCUMENTS

| | | |
|---|---|---|
| CN | 103681667 A | 3/2014 |
| CN | 104247014 A | 12/2014 |
| CN | 107086217 A | 8/2017 |
| CN | 110233613 A | 9/2019 |
| JP | H07202129 A | 8/1995 |
| JP | 2005203446 A | 7/2005 |
| JP | 2006114575 A | 4/2006 |
| JP | 2007287919 A | 11/2007 |
| JP | 2011018676 A | 1/2011 |
| JP | 4765252 B2 | 9/2011 |
| JP | 2012019550 A | 1/2012 |
| JP | 2012151202 A | 8/2012 |
| JP | 2012186968 A | 9/2012 |
| JP | 2014241334 A | 12/2014 |
| JP | 2019086306 A * | 6/2019 |
| JP | 2020013923 A | 1/2020 |
| JP | 2020077674 A | 5/2020 |
| TW | 201417242 A | 5/2014 |
| WO | 2014162844 A1 | 10/2014 |
| WO | 2017141560 A1 | 8/2017 |

OTHER PUBLICATIONS (ISA/237) Written Opinion of the International Search Authority for International Patent Application No. PCT/JP2020/036480, issued/mailed by the Japan Patent Office on Nov. 24, 2020.

Extended European Search Report for European Patent Application No. 20867606.4, issued by the European Patent Office on Mar. 17, 2022.

Office Action issued for counterpart Japanese Application No. 2021-548721, issued by the Japan Patent Office on Oct. 4, 2022 (drafted on Sep. 29, 2022).

Office Action issued for counterpart Japanese Application No. 2021-548472, issued by the Japan Patent Office on Oct. 4, 2022 (drafted on Sep. 29, 2022).

Office Action issued for counterpart U.S. Appl. No. 17/409,823, issued by the US Patent and Trademark Office on Dec. 11, 2023.

Office Action issued for counterpart Chinese Application 202080016044.7, issued by The State Intellectual Property Office of People's Republic of China on Mar. 29, 2024.

* cited by examiner

D-D'

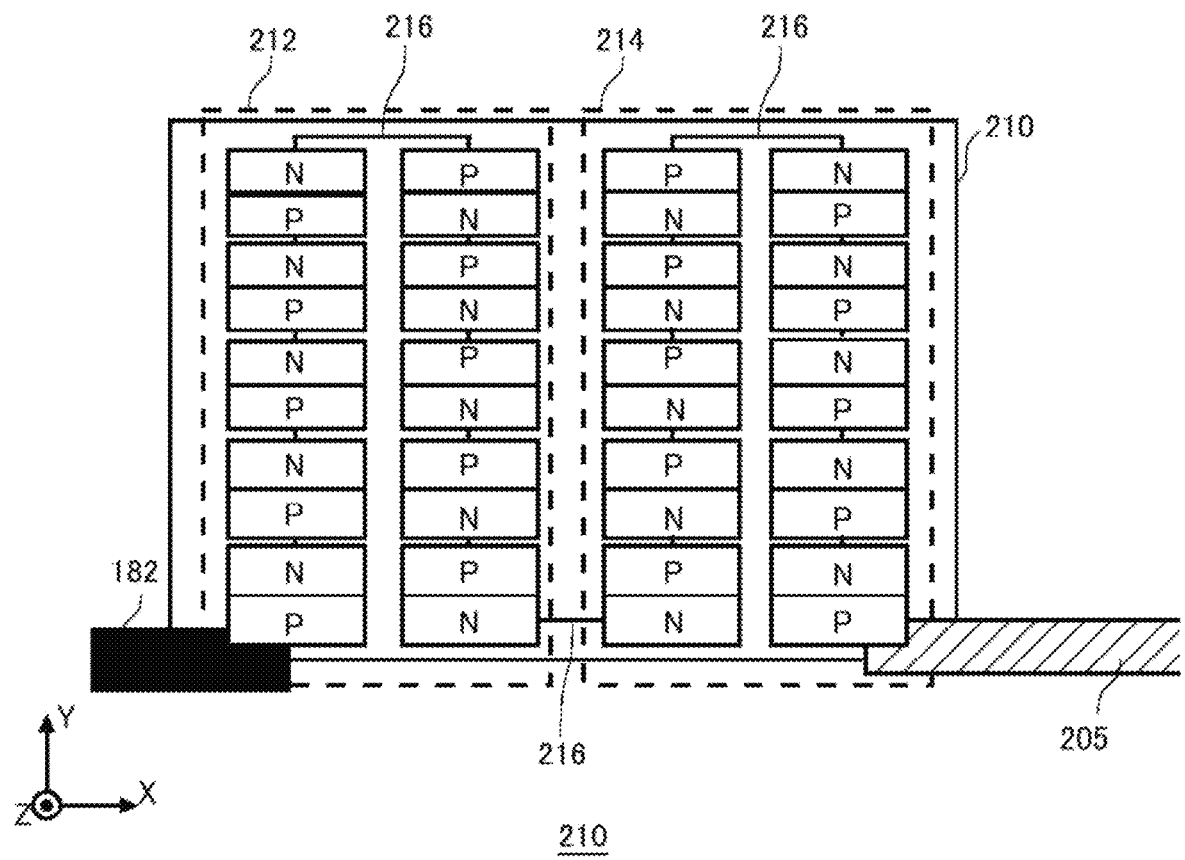
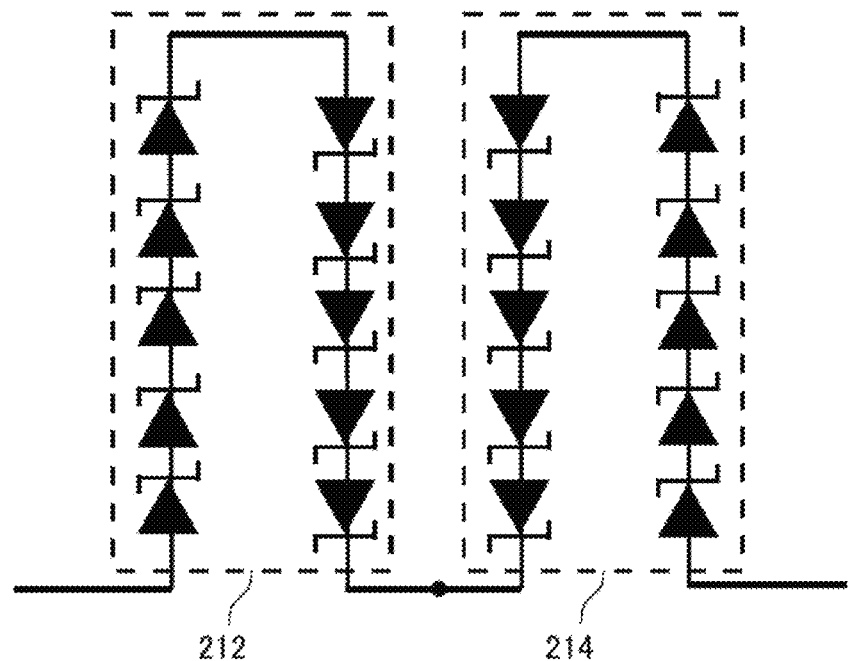
FIG. 10A

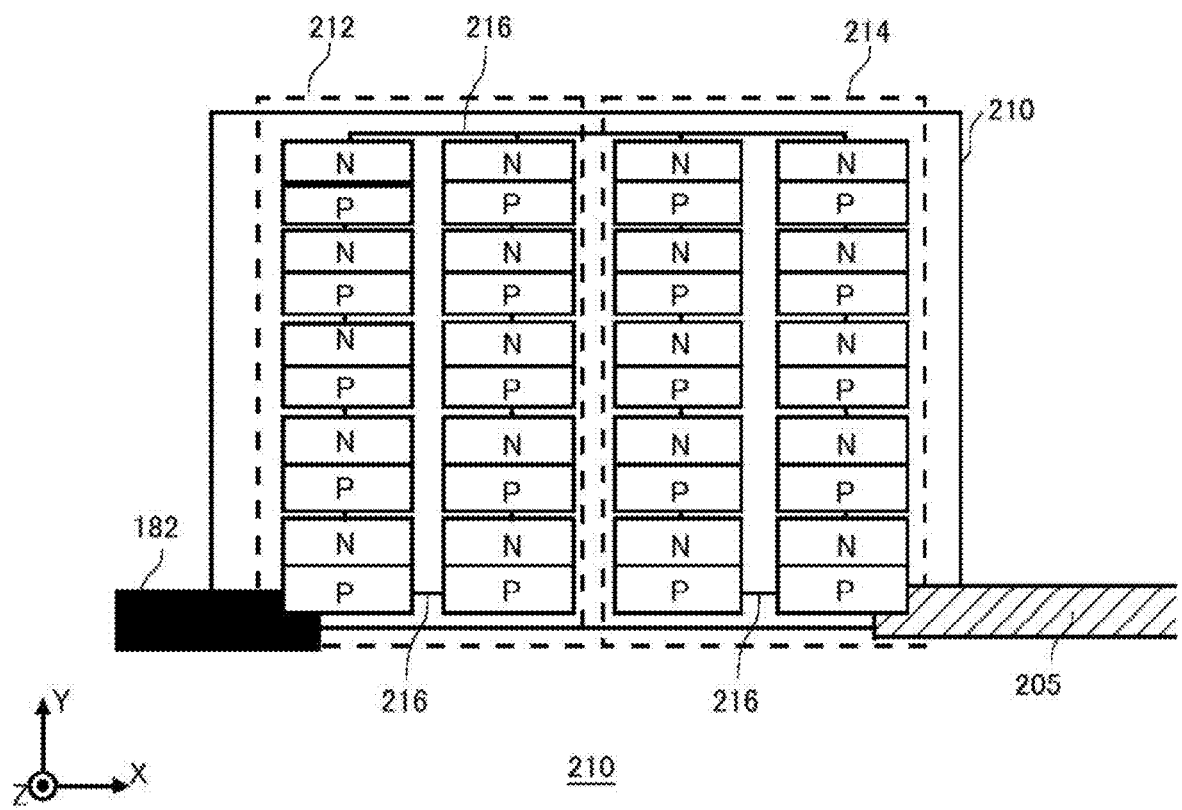
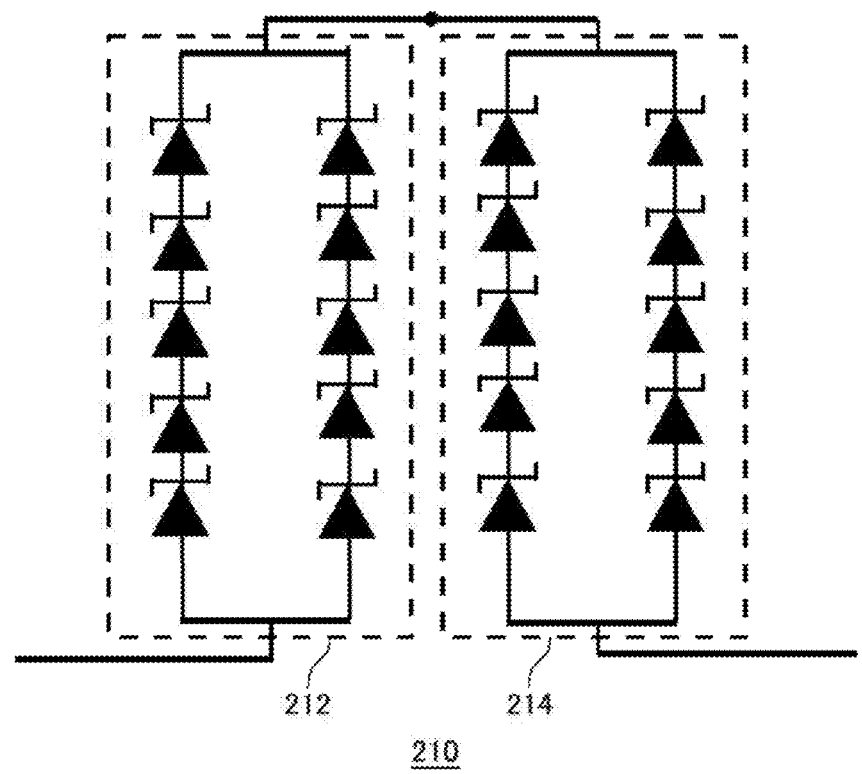
FIG. 10B

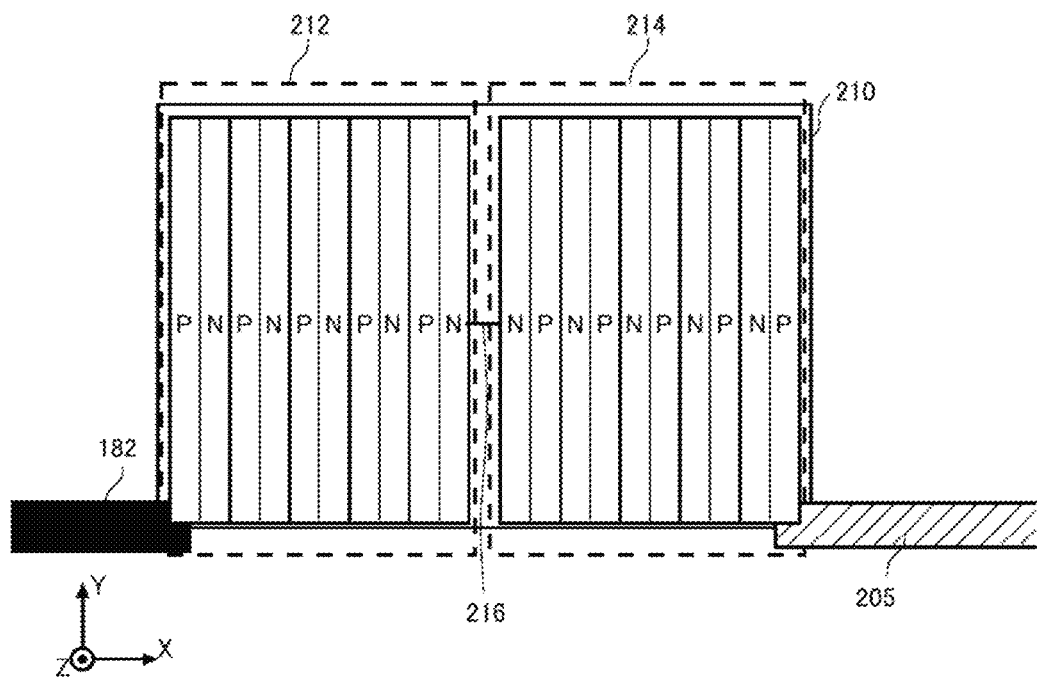
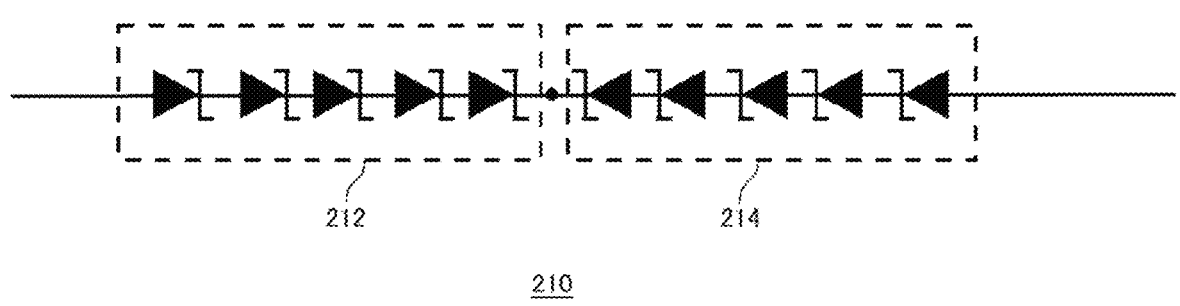
FIG. 10C ns of the following Japanese patent
application(s) are incorporated herein by reference:
  No. 2019-174437 filed in JP on Sep. 25, 2019, and
  No. PCT/JP2020/032956 filed in WO on Aug. 31, 2020.

SEMICONDUCTOR DEVICE

The contents of the following Japanese patent application(s) are incorporated herein by reference:
  No. 2019-174437 filed in JP on Sep. 25, 2019, and
  No. PCT/JP2020/032956 filed in WO on Aug. 31, 2020.

BACKGROUND

1. Technical Field

The present invention relates to a semiconductor device.

2. Related Art

Conventionally, a semiconductor device having a protective diode provided between a MOSFET (Metal Oxide Semiconductor Field Effective Transistor) or the like and a temperature detecting diode has been known (for example, refer to Patent Document 1).

PRIOR ART DOCUMENT

Patent Document

Patent Document 1: Japanese Patent Application Publication No. 2005-203446

BRIEF DESCRIPTION OF THE DRAWINGS

FIG. 10A is one example of a P type region and an N type region provided in the bidirectional diode unit 210.

FIG. 10B is another example of the P type region and the N type region provided in the bidirectional diode.

FIG. 10C is yet another example of the P type region and the N type region provided in the bidirectional diode.

DESCRIPTION OF EXEMPLARY EMBODIMENTS

Figure 1:
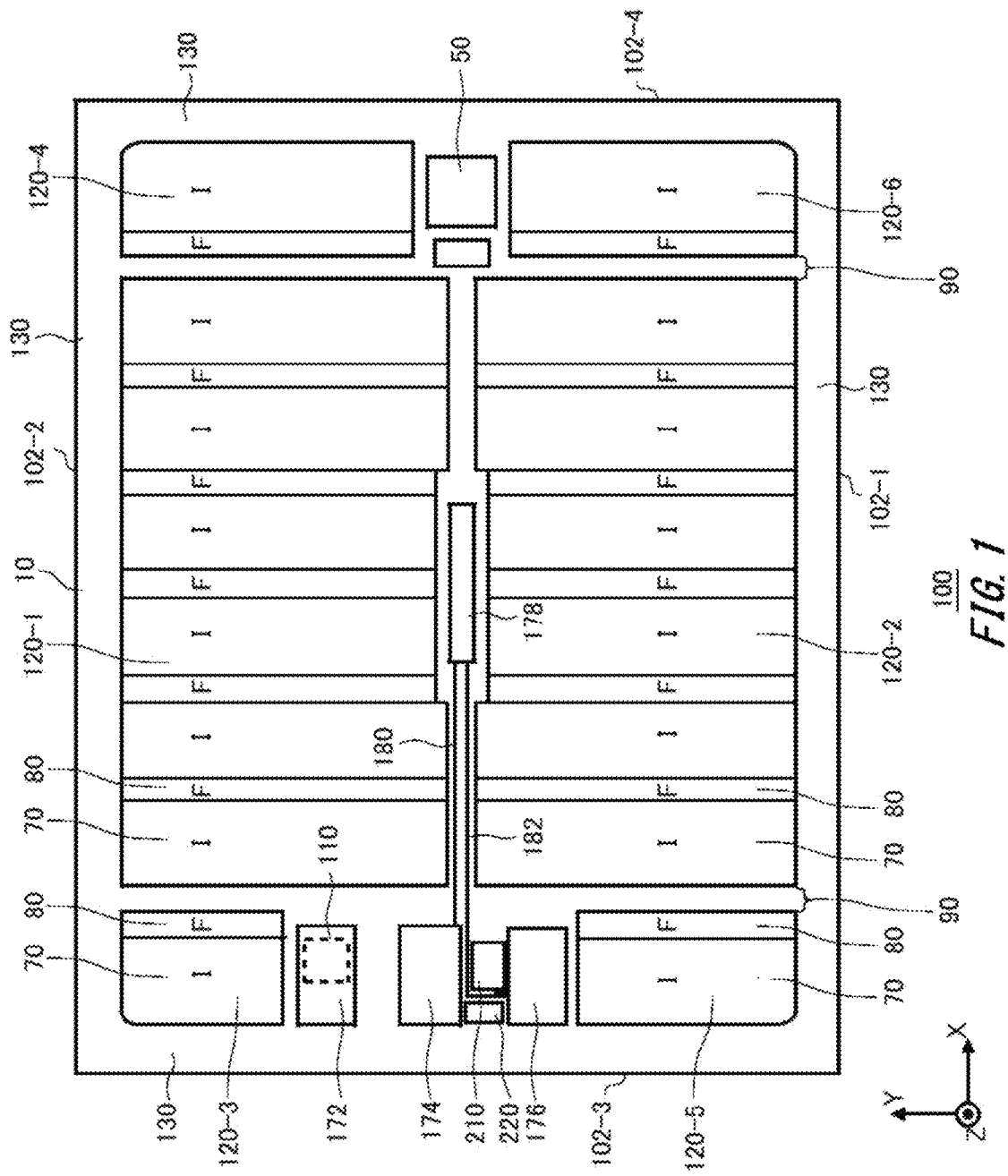
FIG. 1 shows one example of an arrangement of each component on a front surface of a semiconductor device 100 according to Example 1.

Hereinafter, the present invention will be described with embodiments of the invention. However, the following embodiments have no intention of limiting the claimed invention. In addition, some combinations of features described in the embodiments may be unnecessary for solving means of the invention.

Herein, one side of a semiconductor substrate in a direction parallel to a depth direction of the semiconductor substrate is referred to as "front" or "upper", and the opposite side is referred to as "back" or "lower". One of two main surfaces of a substrate, a layer or another member is referred to as an upper surface, and the other is referred to as a lower surface. The direction indicated by "front", "upper", "back", or "lower" is not limited to the gravitational direction or direction of implementing the semiconductor device.

As used herein, technical matters may be described by use of orthogonal coordinate axes of an X axis, a Y axis and a Z axis. The orthogonal coordinate axes are merely used for specifying relative positions between components, and thus not used for limiting the components in a specific direction. For example, the Z axis shall not exclusively indicate a height direction relative to the ground. Note that, a +Z axis direction and a −Z axis direction are directions opposite to each other. When the Z axis direction is described without a positive or a negative sign, the Z axis direction indicates a direction parallel to the +Z axis and the −Z axis. Also, as used herein, a top plan view may be a view seen from the +Z axis direction.

One mentioned herein as "the same" or "equal" may include one with error derived from a variation in manufacturing or the like. This error is the one within a range of 10%, for example.

As used herein, a conductivity type of a doping region doped with an impurity is described as P type or N type. However, the conductivity type of each doping region may also be of inverse polarity. Also, as used herein, P+ type or N+ type has doping concentration higher than that of P type or N type, respectively, and P− type or N− type has doping concentration lower than that of P type or N type, respectively.

As used herein, doping concentration refers to concentration of impurities activated as donors or acceptors. As used herein, the concentration difference between donors and acceptors may be concentration of the one with higher concentration between the donors and the acceptors. The concentration difference can be measured by the capacitance-voltage profiling (CV profiling). Further, carrier concentration measured by the spreading resistance (SR) profiling may be considered as concentration of donors or acceptors. Furthermore, when concentration distribution of donors or acceptors has a peak in a region, a value of the peak may be set as concentration of the donors or the acceptors in this region. In a region where donors or acceptors are present, when concentration of the donors or the acceptors is substantially uniform or the like, an average value of donor concentration or acceptor concentration in this region may be set as donor concentration or acceptor concentration.

FIG. 1 shows one example of an arrangement of each component on a front surface of a semiconductor device 100 according to Example 1. The semiconductor device 100 includes a semiconductor substrate 10, a gate pad 50, a current sensing pad 172, a temperature sensing unit 178, an anode pad 174 and a cathode pad 176 electrically connected to the temperature sensing unit 178, a bidirectional diode unit 210, and a protective diode unit 220.

The semiconductor substrate 10 has an edge 102. As used herein, in a top plan view of FIG. 1, a direction along one edge 102-1 of the semiconductor substrate 10 is considered to be an X axis direction, and a direction perpendicular to the X axis direction is considered to be a Y axis direction. In the present example, the X axis is taken in a direction along the edge 102-1. A direction being perpendicular to the X axis direction and the Y axis direction, and forming a right-hand system with the X axis direction and the Y axis direction is referred to as a Z axis direction. The temperature sensing unit 178 of the present example is provided in a +Z axis direction of the semiconductor substrate 10.

The semiconductor substrate 10 is formed of semiconductor material such as a silicon semiconductor or a compound semiconductor. A side of the semiconductor substrate 10 on which the temperature sensing unit 178 is provided is referred to as a front surface, and the opposite side is referred to as a back surface. As used herein, a direction connecting the front surface and the back surface of the semiconductor substrate 10 is referred to as a depth direction. Although the semiconductor substrate 10 of the present example has a substantially rectangular shape on the front surface, the semiconductor substrate 10 may be in a different shape.

The semiconductor substrate 10 has an active section 120 on the front surface. The active section 120 is a region in which main current flows in the depth direction between the front surface and the back surface of the semiconductor substrate 10 when the semiconductor device 100 is turned on. A gate conductor 44 in the active section 120, which will be described later, is connected to the gate pad 50 by a gate runner 48, which will also be described later.

The active section 120 may be divided into an active section 120-1, an active section 120-2, an active section 120-3, an active section 120-4, an active section 120-5, and an active section 120-6 upon arrangement. Specifically, the active section 120-1, the active section 120-3, and the active section 120-4 may be separated by a separation part 90 in the X axis direction. Similarly, the active section 120-2, the active section 120-5, and the active section 120-6 may be separated by the separation part 90 in the X axis direction. The active section 120-1, the active section 120-3, and the active section 120-4 are arranged away from each other in the X axis direction in the present example, and electrically connected to each other by an emitter electrode 52, which will be described later. Similarly, the active section 120-2, the active section 120-5, and the active section 120-6 are electrically connected to each other by the emitter electrode 52, which will be described later.

The active section 120 may be provided with a transistor section 70 including a transistor element such as an IGBT (insulated gate bipolar transistor). The active section 120 may also be provided with a diode section 80 including a diode element such as a FWD (freewheeling diode). When the active section 120 is provided with the IGBT and the FWD, the transistor section 70 and the diode section 80 form an RC-IGBT (Reverse Conducting IGBT). The active section 120 may be a region in which at least one of the transistor section 70 and the diode section 80 is provided.

In the present example, a region in the active section 120 in which the transistor section 70 is arranged is marked with a character "T", and a region in the active section 120 in which the diode section 80 is arranged is marked with a character "F". The transistor section 70 and the diode section 80 may be alternately arranged in each region in the active section 120 along the X axis direction.

Note that, this is an example of an arrangement of the transistor section 70 and the diode section 80 of the present example, and thus different arrangement may also be adopted. For example, the diode section 80 may be arranged on a negative X axis direction side in the active section 120-3.

The semiconductor device 100 has a well region 130 of P+ type closer to the periphery of the front surface than the active section 120, and also has an edge termination structure closer to the periphery than the well region 130. The edge termination structure includes, for example, a guard ring that is annularly provided so as to surround the active section 120, or a field plate, or a combination thereof.

The temperature sensing unit 178 may be arranged on a wide portion provided near the center of the front surface of the semiconductor substrate 10. The wide portion has no active section 120. When the active sections 120 of the semiconductor substrate 10 are integrated, the center of the semiconductor substrate 10 is easily heated by heat generated from switching devices which are formed in the active sections 120. Temperature of the transistor section 70 can be monitored by providing the temperature sensing unit 178 on the wide portion provided near the center. Thereby, overheating of the transistor section 70, which is caused by the transistor section 70 exceeding a bonding temperature Tj set as a range of a normal operation temperature, can be prevented.

The temperature sensing unit 178 may be formed of a temperature sensing diode. An anode and a cathode of the temperature sensing diode are connected to a metal anode wiring 180 and a metal cathode wiring 182, respectively. The anode wiring 180 and the cathode wiring 182 contain metal such as aluminum.

The cathode pad 176 is connected to the temperature sensing unit 178 via the cathode wiring 182. The anode pad 174 is connected to the temperature sensing unit 178 via the anode wiring 180. The cathode pad 176 and the anode pad 174 are electrodes containing metal such as aluminum.

The current sensing pad 172 is electrically connected to a current sensing unit 110. The current sensing pad 172 is one example of the front surface electrode. The current sensing unit 110 has a structure similar to the structure of the transistor section 70 in the active section 120, and simulates operations of the transistor section 70. Current that flows into the current sensing unit 110 is in proportion to current that flows into the transistor section 70. Thereby, current flow of the transistor section 70 can be monitored.

Note that, the current sensing unit 110 is different from the transistor section 70 in that the current sensing unit 110 has no emitter region 12, which will be described later. Thereby, the current sensing unit 110 does not operate as a transistor. The current sensing unit 110 is provided with a gate trench. The gate trench of the current sensing unit 110 is electrically connected to the gate runner 48.

The bidirectional diode unit 210 is arranged between the anode pad 174 and the cathode pad 176 on the front surface of the semiconductor device 100. The bidirectional diode unit 210 includes a diode electrically connected in a serial bidirectional way between the anode pad 174 and the cathode pad 176. The bidirectional diode unit 210 prevents the temperature sensing unit 178 from being damaged by electro-static discharge (ESD).

The protective diode unit 220 is provided between the anode pad 174 and the cathode pad 176. The protective diode unit 220 is electrically connected to the anode pad 174 and the cathode pad 176. The protective diode unit 220 includes diodes of which PN junctions are arranged in an antiparallel direction relative to a direction of PN junctions of diodes included in the temperature sensing unit 178. The diodes of the protective diode unit 220 may have the same design as a design of the diodes of the temperature sensing unit 178, except that the direction of the PN junctions being different. The protective diode unit 220 prevents the temperature sensing unit 178 from being applied with an overvoltage or receiving excessive current due to noise or the like during operation of the temperature sensing unit 178.

Figure 2:
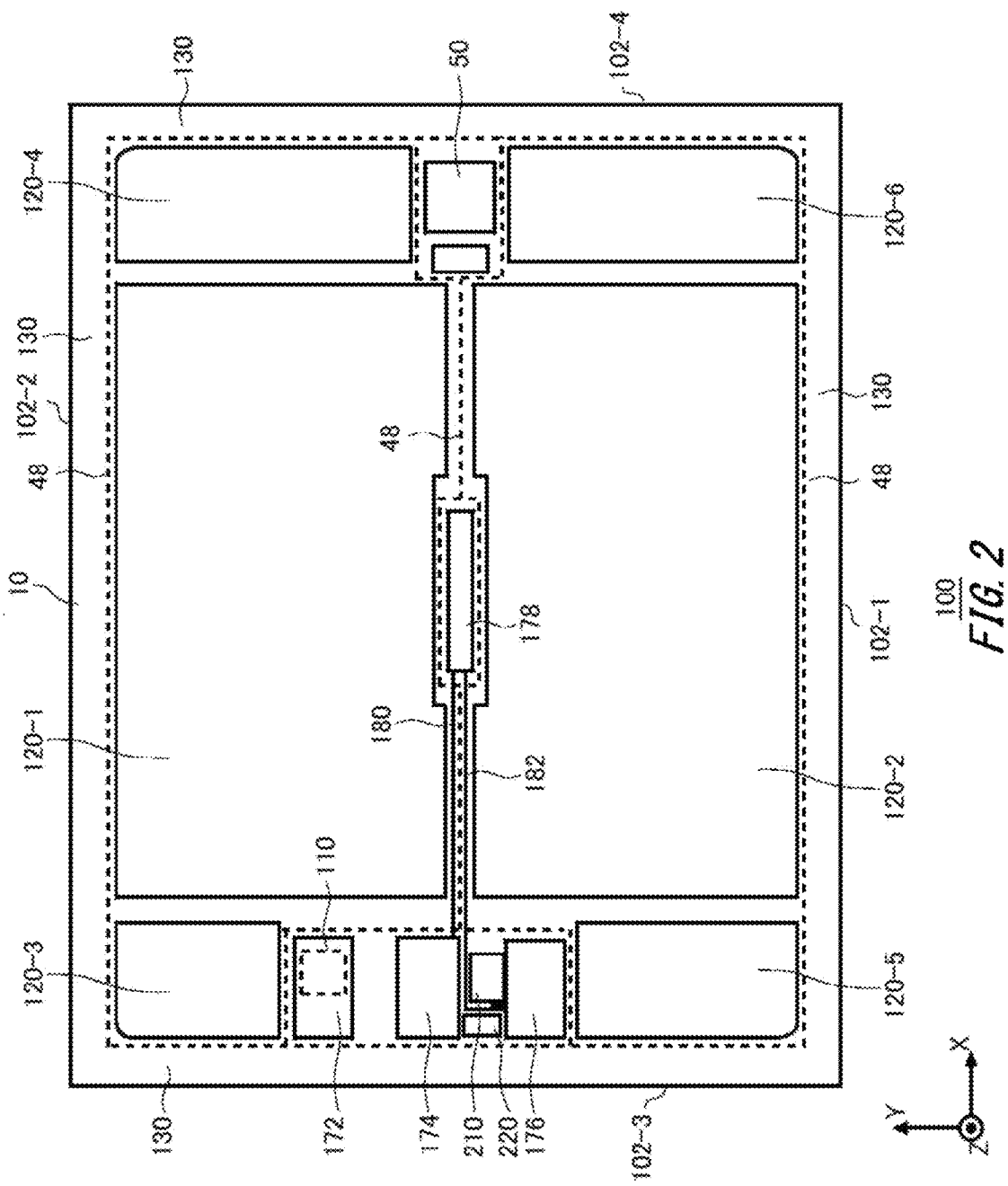
FIG. 2 shows one example of an arrangement of a gate runner 48 on the front surface of the semiconductor device 100.

FIG. 2 shows one example of an arrangement of the gate runner 48 on the front surface of the semiconductor device 100. The gate runner 48 is arranged at a position indicated by a dashed line on the front surface of the semiconductor substrate 10.

The gate runner 48 is a wiring formed of polysilicon that is added with an impurity, or conductive material such as metal, which is covered by an insulation film such as polyimide. The gate runner 48 may be electrically connected to the gate pad 50. The gate runner 48 is also connected to the gate conductor 44, which will be described later, of the transistor section 70 arranged in the active section 120, and sets the gate conductor 44 to a gate potential. The gate conductor 44 corresponds to a gate electrode of the transistor section 70. Thereby, a transistor of the transistor section 70 is switched ON.

The gate runner 48 may be arranged above the well region 130 in the vicinity of the active section 120. The gate runner 48 may be arranged in the wide portion provided near the center of the semiconductor substrate 10 and being between the active section 120-1 and the active section 120-2, so as to surround the temperature sensing unit 178.

The gate pad 50 is electrically connected to an external control terminal. The gate pad 50 is formed of a conductor made of metal such as aluminum. The gate pad 50 may be externally connected by means of wire bonding.

Figure 3:
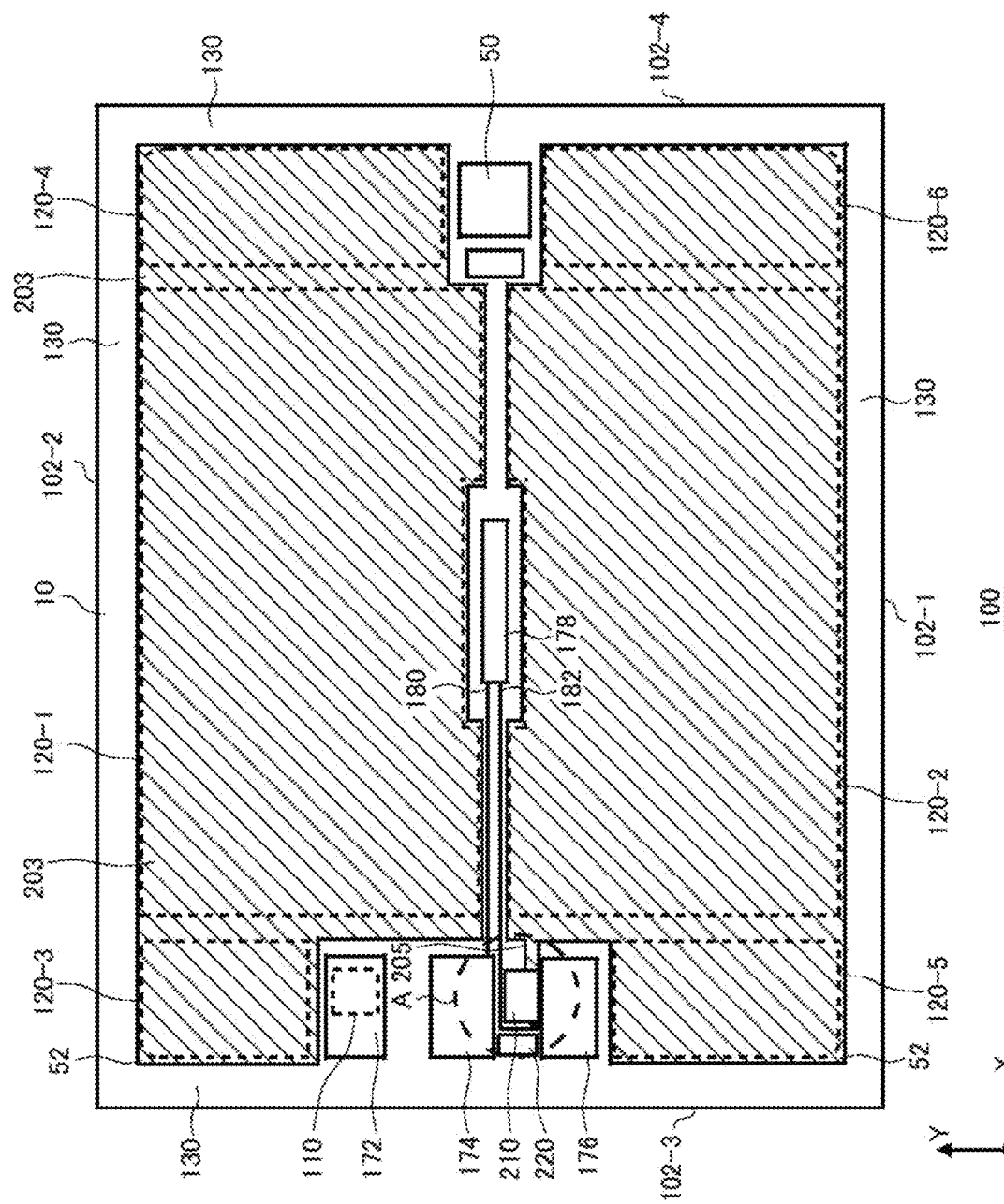
FIG. 3 is one example of an arrangement of an emitter electrode 52 provided on the front surface of the semiconductor device 100.

FIG. 3 is one example of an arrangement of the emitter electrode 52 provided on the front surface of the semiconductor device 100. The emitter electrode 52 is formed of a conductor made of metal such as aluminum. The emitter electrode 52 is set to an emitter potential being a predetermined reference potential. The emitter potential may be set to a ground potential. Similar to the current sensing pad 172, the emitter electrode 52 is another example of the front surface electrode.

The emitter electrode 52 is arranged in a region indicated with diagonal lines. The emitter electrode 52 has a main metal portion 203 that entirely covers the active section 120. Also, the emitter electrode 52 is provided in a region above the separation part 90 so as to electrically connect each of the active section 120-1, the active section 120-2, and the active section 120-3 which are separated from each other by the separation part 90 in the X axis direction. Similarly, the active section 120-4, the active section 120-5, and the active section 120-6 are electrically connected to each other by the emitter electrode 52.

Further, the emitter electrode 52 has a connector 205 for connecting the main metal portion 203 and the bidirectional diode unit 210. The connector 205 may be provided integrally with the emitter electrode 52. The bidirectional diode unit 210 has one end electrically connected to the cathode pad 176, and the other end electrically connected to the emitter electrode 52 via the connector 205. Structure in the vicinity of the connector 205 will be described later.

Figure 4:
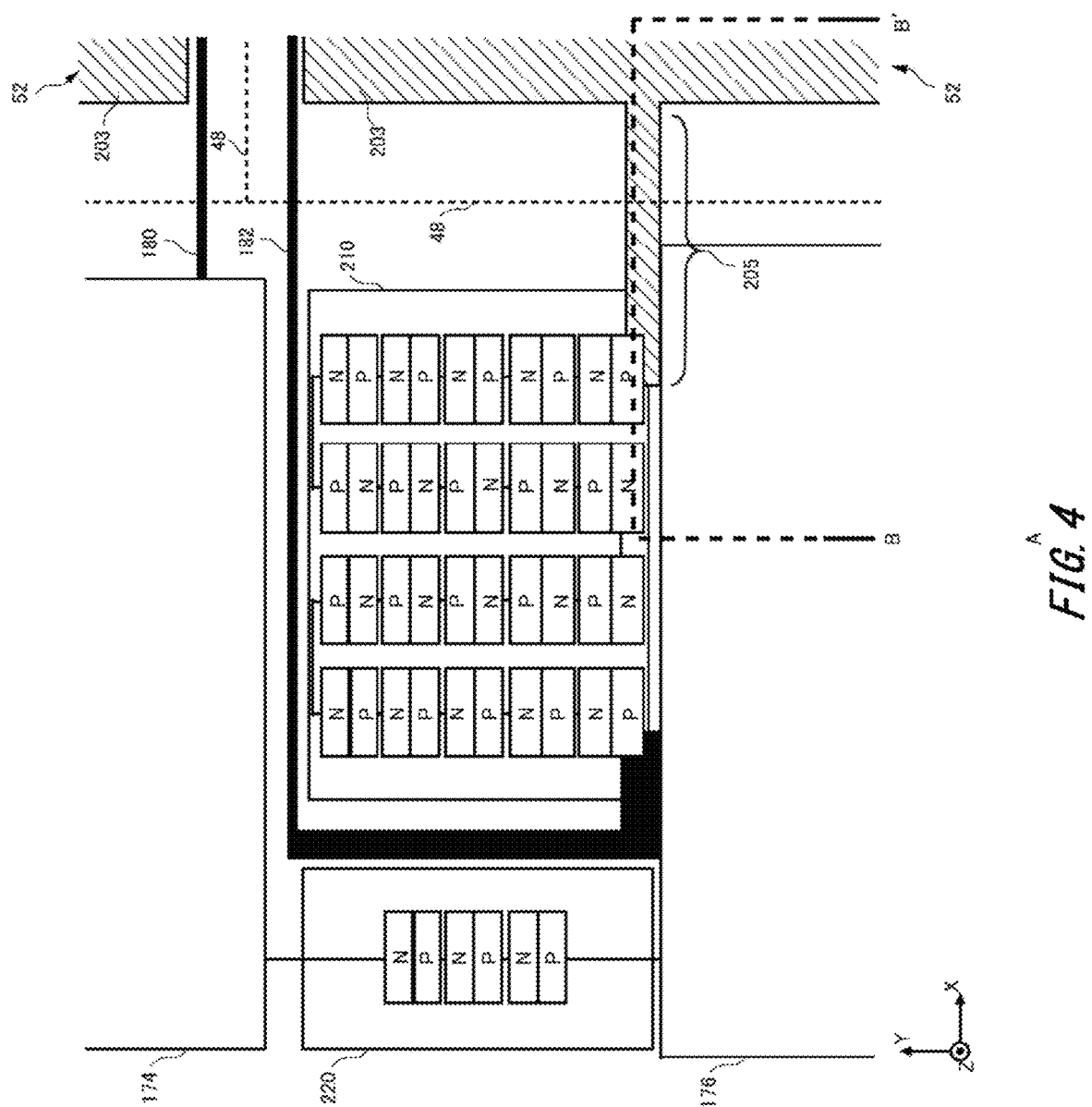
FIG. 4 shows one example of an enlarged view in the vicinity of a bidirectional diode unit 210 on the front surface of the semiconductor device 100.

FIG. 4 shows one example of an enlarged view in the vicinity of the bidirectional diode unit 210 on the front surface of the semiconductor device 100. FIG. 4 is one example of an enlarged view of a region A in FIG. 3. The bidirectional diode unit 210 includes two diode groups that are electrically connected in a serial bidirectional way such that cathodes in the diode groups face each other. Each of the two diode groups includes one or more diodes.

In the bidirectional diode unit 210 of the present example, cathodes of each ten diodes that are electrically connected in series face each other. Specifically, the bidirectional diode unit 210 of the present example includes Zener diodes connected in a bidirectional way. A Zener diode is formed by creating high doping concentration in a dopant diffusion region in a diode. Note that, the diode included in the bidirectional diode unit 210 is not limited to a Zener diode. As one example, a dopant in the diffusion region of the bidirectional diode unit 210 may be boron in a P type region, and arsenic in an N type region.

The Zener diode has a large difference in band energy between a P type region and an N type region. When reverse bias voltage is applied, Zener breakdown occurs due to electrons causing tunneling effect at a low voltage in a depletion layer. Zener breakdown phenomenon shows abrupt current change at a breakdown voltage with an occurrence of avalanche breakdown phenomenon, in which accelerated free electrons move across the depletion layer. In other words, the Zener diode shows low resistance when applied with a voltage of a certain value or more, which makes current drastically easy to flow into the Zener diode. When an emitter potential is earthed, voltage from electro-static discharge is discharged to the ground potential.

Therefore, when becoming low resistance upon occurrence of electro-static discharge, current can be discharged to the Zener diode and thereby elements can be protected from overvoltage or excessive current which derives from the electro-static discharge. In addition, since the Zener diode has a polarity, by bidirectionally connecting Zener diodes in an anti-serial way, protection can be provided against overvoltage or excessive current caused by both of positive and negative voltage surges.

The bidirectional diode unit 210 of the present example is arranged in a region between the anode pad 174 and the cathode pad 176. When an element is influenced by electro-static discharge, and thereby connecting the cathode pad 176 and a P+ type well region 130 that is provided closer to the periphery of the semiconductor substrate 10 than the active section 120, the temperature sensing unit 178 shows a larger resistance which causes deterioration to a temperature sensing characteristic of the temperature sensing unit 178. Since the bidirectional diode unit 210 of the present example is provided near the cathode pad 176, the bidirectional diode unit 210 can quickly perform operation in the vicinity of the cathode pad 176 in response to Zener breakdown. In this manner, the temperature sensing unit 178 is appropriately protected from electro-static discharge, thereby characteristics of the temperature sensing unit 178 can be maintained at a good level.

Since the bidirectional diode unit 210 is arranged in a region between the anode pad 174 and the cathode pad 176, a space can be saved and utilized effectively when downsizing the semiconductor device 100. Further, since lengths of the anode wiring 180 and the cathode wiring 182 are kept short, a low self-inductance is maintained.

The bidirectional diode unit 210 of the present example and the main metal portion 203 of the emitter electrode 52 are connected by the connector 205 that extends so as to cross over the gate runner 48. This arrangement of the connector 205 of the present example ensures a large area for the main metal portion 203 and the active section 120 to be provided.

The protective diode unit 220 of the present example has three diodes which are connected in series. However, the number of diodes is not limited, provided that diodes are connected in series. The protective diode unit 220 may be arranged between the anode pad 174 and the cathode pad 176. A PN junction in a diffusion region of the protective diode unit 220 is electrically connected so as to have a forward-direction being opposite to a forward-direction of a PN junction of the temperature sensing diode of the temperature sensing unit 178, which is parallel to the protective diode unit 220. Apart from the fact that the protective diode unit 220 is connected in an antiparallel direction of the temperature sensing unit 178, the protective diode unit 220 may be a diode having the same structure as a structure of the temperature sensing unit 178.

Figure 5:
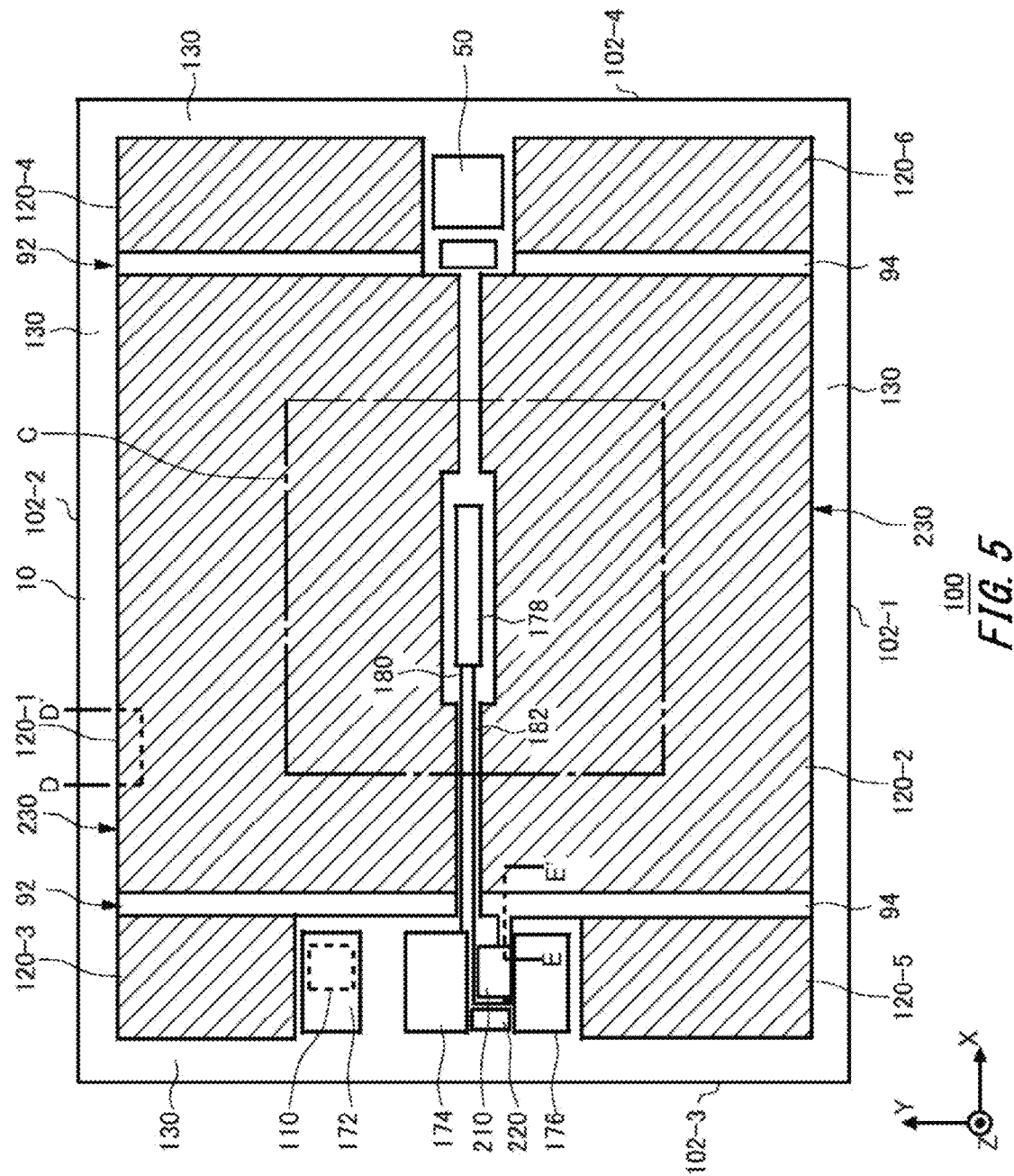
FIG. 5 is one example of a top view of the semiconductor device 100.

FIG. 5 is one example of a top view of the semiconductor device 100. This diagram shows a front surface of the semiconductor device 100 on which the emitter electrode 52 is arranged, followed by the protective film 92 and the plated layer 230.

The plated layer 230 is arranged in a region indicated with diagonal lines. The plated layer 230 includes metal such as nickel that is suitable for soldering. The plated layer 230 may be above the active section 120.

A region C of the plated layer 230 is provided with a metal wiring layer, which is then electrically connected to a main terminal of the semiconductor device 100 by means of lead-free soldering or the like. As one example, the metal wiring layer is a lead frame including metal such as copper. The region C of the present example has a rectangular shape by way of example, and thus a shape of the region C is not limited to a rectangle.

The protective film 92 is provided above the separation part 90 on the front surface of the semiconductor substrate 10. An extending portion 94 extends along the separation part 90 in a predetermined direction. The extending portion 94 of the present example extends in a Y axis direction. The extending portion 94 to extend may have a furrow-like (rib-like) shape. The protective film 92 includes, as one example, an insulating material such as polyimide. Since each pad can be externally connected by means of wire bonding or the like, the protective film 92 may be provided on an upper surface of the current sensing pad 172, the anode pad 174, and the cathode pad 176.

The bidirectional diode unit 210 may be arranged closer to a periphery of the front surface of the semiconductor substrate 10 than the extending portion 94. The furrow-like (rib-like) shape of the extending portion 94 can prevent solder from entering into the bidirectional diode unit 210 while soldering the plated layer 230. When solder is asymmetrically formed, the semiconductor device 100 experiences stress concentration, a warpage caused by the stress concentration, peeling of an electrode, or the like. By preventing an overflowing of solder, the stress concentration caused by the solder can be prevented, as is peeling of an electrode. Thereby, reliability of the semiconductor device 100 improves.

The protective film 92 is provided above the connector 205. The protective film 92 prevents solder from flowing into the connector 205 and the bidirectional diode unit 210 through the connector 205. Accordingly, the connector 205 having a narrower width than the main metal portion 203 can be prevented from experiencing stress concentration due to inflow of solder. Accordingly, reliability of the semiconductor device 100 improves.

Figure 6:
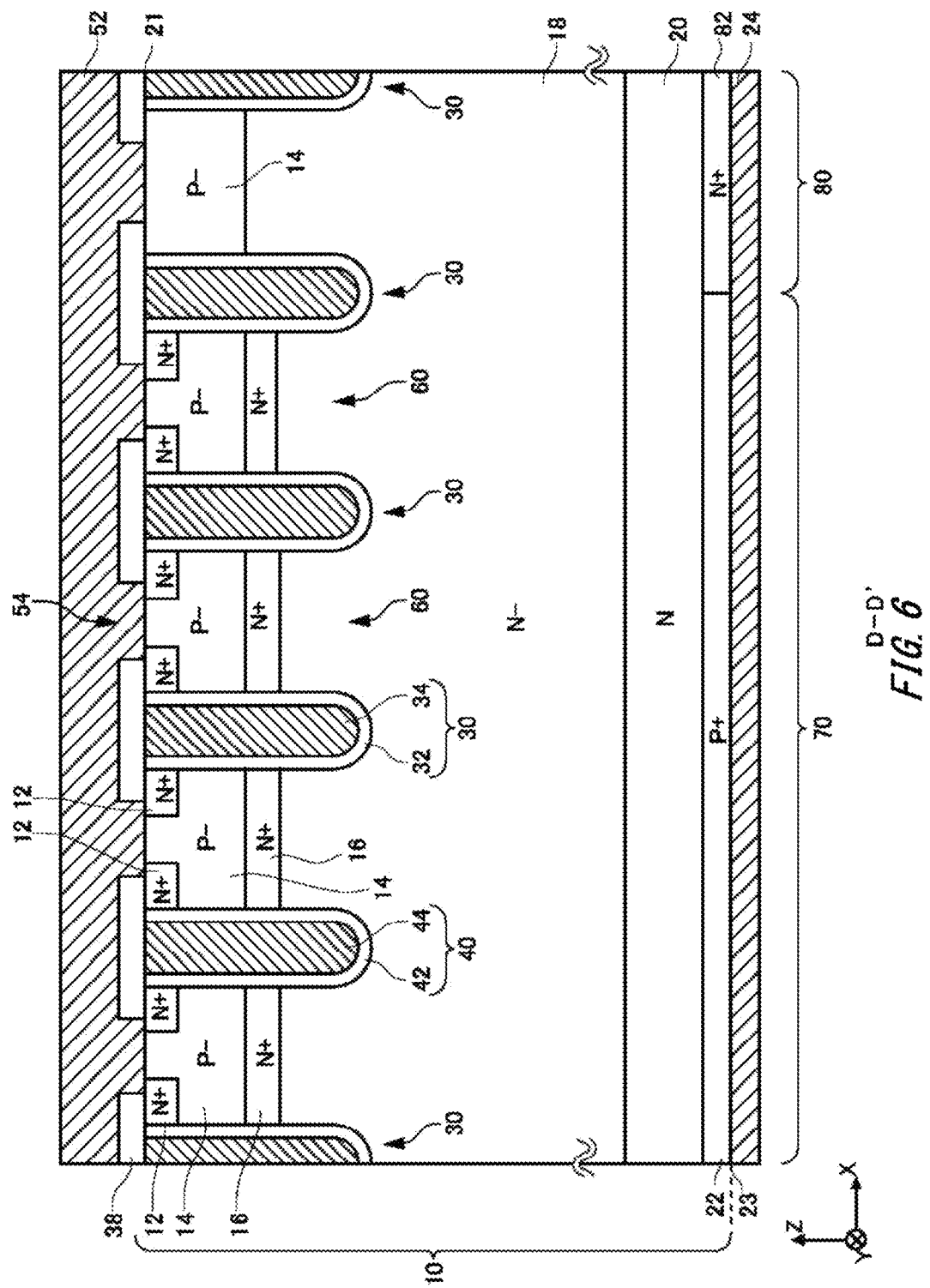
FIG. 6 is one example of an XZ cross sectional view of the semiconductor device 100.

FIG. 6 is one example of an XZ cross sectional view of the semiconductor device 100. The present example is one example of the cross section D-D' of FIG. 5.

The transistor section 70 has a plurality dummy trenches 30 and a plurality of gate trenches 40 on the front surface of the semiconductor substrate 10, and the diode section 80 has a plurality of dummy trenches 30 on the front surface of the semiconductor substrate 10. Also, the semiconductor substrate 10 has a mesa portion 60 being a dopant diffusion region between each of the plurality of trenches. The mesa portion 60 is connected to an emitter electrode via a contact hole 54.

The dummy trench 30 has a dummy insulating film 32 and a dummy conductor 34. The dummy conductor 34 is electrically connected to the emitter electrode 52 via a contact hole, which will be described later, and set to the emitter potential.

The gate trench 40 includes the gate conductor 44 configured by a conductor such as metal, and a gate insulating film 42 provided between the gate conductor 44 and the active section 120. The gate conductor 44 is insulated from the emitter electrode 52 by an interlayer dielectric film 38. The gate conductor 44 is electrically connected to the gate pad 50 by the gate runner 48, and set to the gate potential. The gate conductor 44 corresponds to the gate electrode of the transistor section 70. As one example, the gate potential may be a higher potential than the emitter potential.

The transistor section 70 has an emitter region 12 of a first conductivity type, a base region 14 of a second conductivity type, a drift region 18 of the first conductivity type provided under the base region 14, and a collector region 22 of the second conductivity type in this order from the front surface of the semiconductor substrate 10. Note that, the emitter region 12 may only cover regions near the dummy trench 30 and the gate trench 40 instead of covering the entire mesa portion 60 on the front surface of the semiconductor substrate 10. On the front surface of the semiconductor substrate 10, a region in which the mesa portion 60 is not covered by the emitter region 12 may have the base region 14 exposed on the front surface.

The transistor section 70 of the present example has an accumulation region 16 of a first conductivity type that is provided between the base region 14 and the drift region 18. By providing the accumulation region 16, carrier IE (Injection Enhancement) effect can be improved in the base region 14, and thus on-voltage can be reduced. Note that, the accumulation region 16 may be omitted.

As one example, a polarity of the emitter region 12 is N+ type. That is, in the present example, a first conductivity type is N type and a second conductivity type is P type. However, the first conductivity type may be P type and the second conductivity type may be N type instead. In this case, conductivity types of substrates, layers, regions, or the like in each embodiment example would be of inverse polarity.

The base region 14 of the present example has a P− type polarity. When the gate conductor 44 is set to the gate potential, electrons are withdrawn in the base region 14 toward the gate trench 40. An N type channel is then formed in a region in which the base region 14 is in direct contact with the gate trench 40, and thus drives as a transistor.

In the diode section 80, a P− type base region 14 is provided on the upper surface 21 of the semiconductor substrate 10. The diode section 80 of the present example has no accumulation region 16. Alternatively, in another example, the diode section 80 may have an accumulation region 16.

An N− type drift region 18 is provided under the accumulation region 16 of the transistor section 70, and under the base region 14 of the diode section 80. An N type buffer region 20 is provided under the drift region 18 of both of the transistor section 70 and the diode section 80. The buffer region 20 may serve as a field stop layer for preventing a depletion layer expanding from the lower surface of the base region 14 from reaching a P+ type collector region 22 and an N+ type cathode region 82.

In the transistor section 70, the P+ type collector region 22 is provided under the buffer region 20. In the diode section 80, the N+ type of cathode region 82 is provided under the buffer region 20.

A surface under the collector region 22 and the cathode region 82 corresponds to a lower surface 23 of the semiconductor substrate 10. The lower surface 23 of the semiconductor substrate 10 is provided with a collector electrode 24. The collector electrode 24 is formed of a conductive material such as metal.

Figure 7:
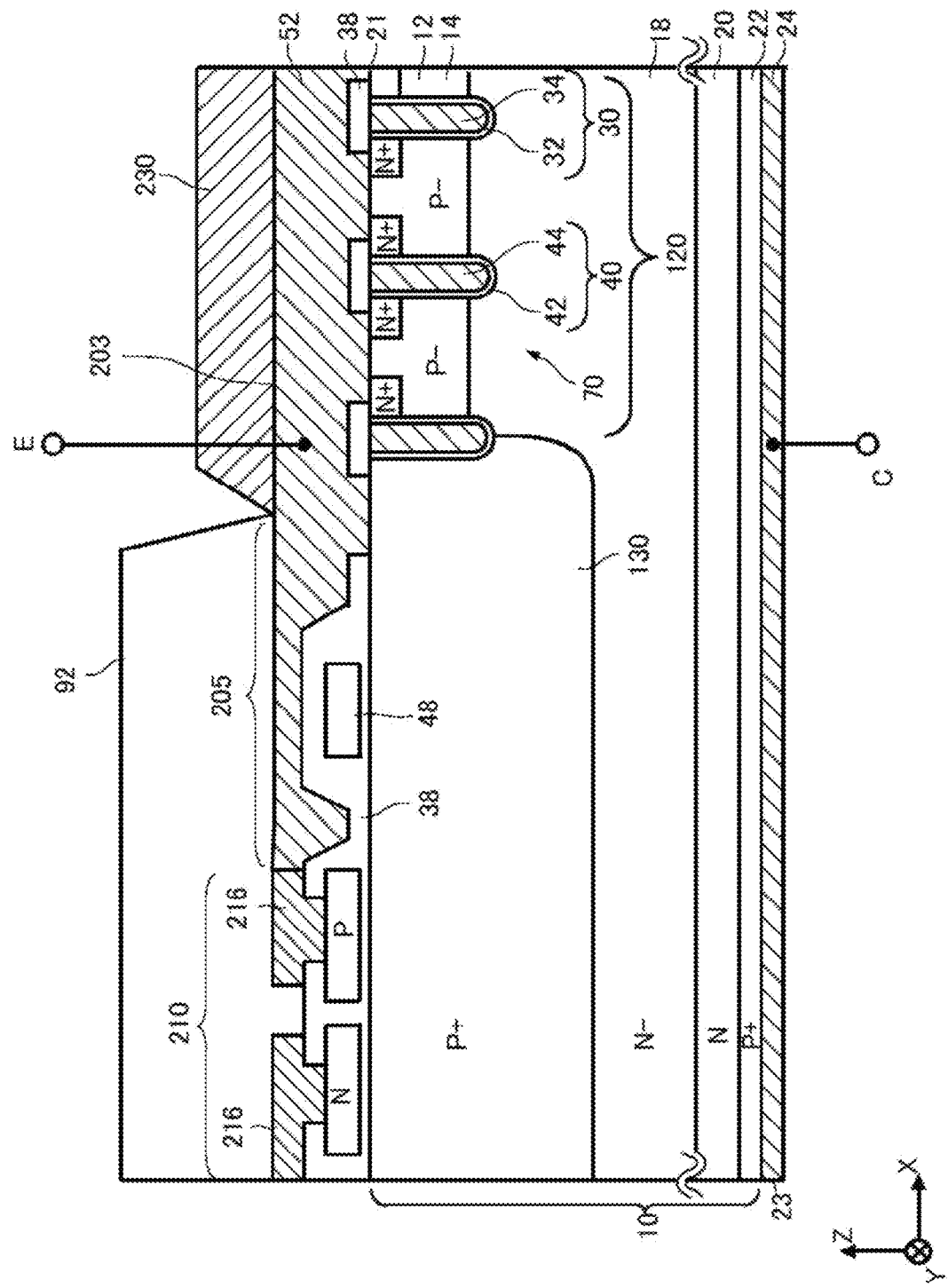
FIG. 7 is one example of a cross sectional view in the vicinity of a connector 205 and the bidirectional diode unit 210 of the semiconductor device 100.

FIG. 7 is one example of a cross sectional view in the vicinity of a connector 205 and the bidirectional diode unit 210 of the semiconductor device 100. The present example is one example of the cross section B-B' of FIG. 4 and the E-E' cross section of FIG. 5.

In the present example, the transistor section 70 is provided in the active section 120 near the well region 130. However, the diode section 80 may be provided in this region instead. The emitter electrode 52 is provided above the active section 120, and the plated layer 230 is provided above the emitter electrode 52. The protective film 92 is provided above the connector 205 and the bidirectional diode unit 210. A diffusion region under the well region 130 may be of the same structure as that of the transistor section 70.

The emitter electrode 52 has the connector 205. The connector 205 of the present example crosses over the gate runner 48. An end of the connector 205 is connected to a wiring 216 between diffusion regions which is connected to an anode of the bidirectional diode unit 210. The bidirectional diode unit 210 has wirings 216 between diffusion regions which are connected to cathodes connected in an anti-serial way so as to face each other. Diffusion regions of the gate runner 48 and the bidirectional diode unit 210 may be insulated by the interlayer dielectric film 38.

Figure 8:
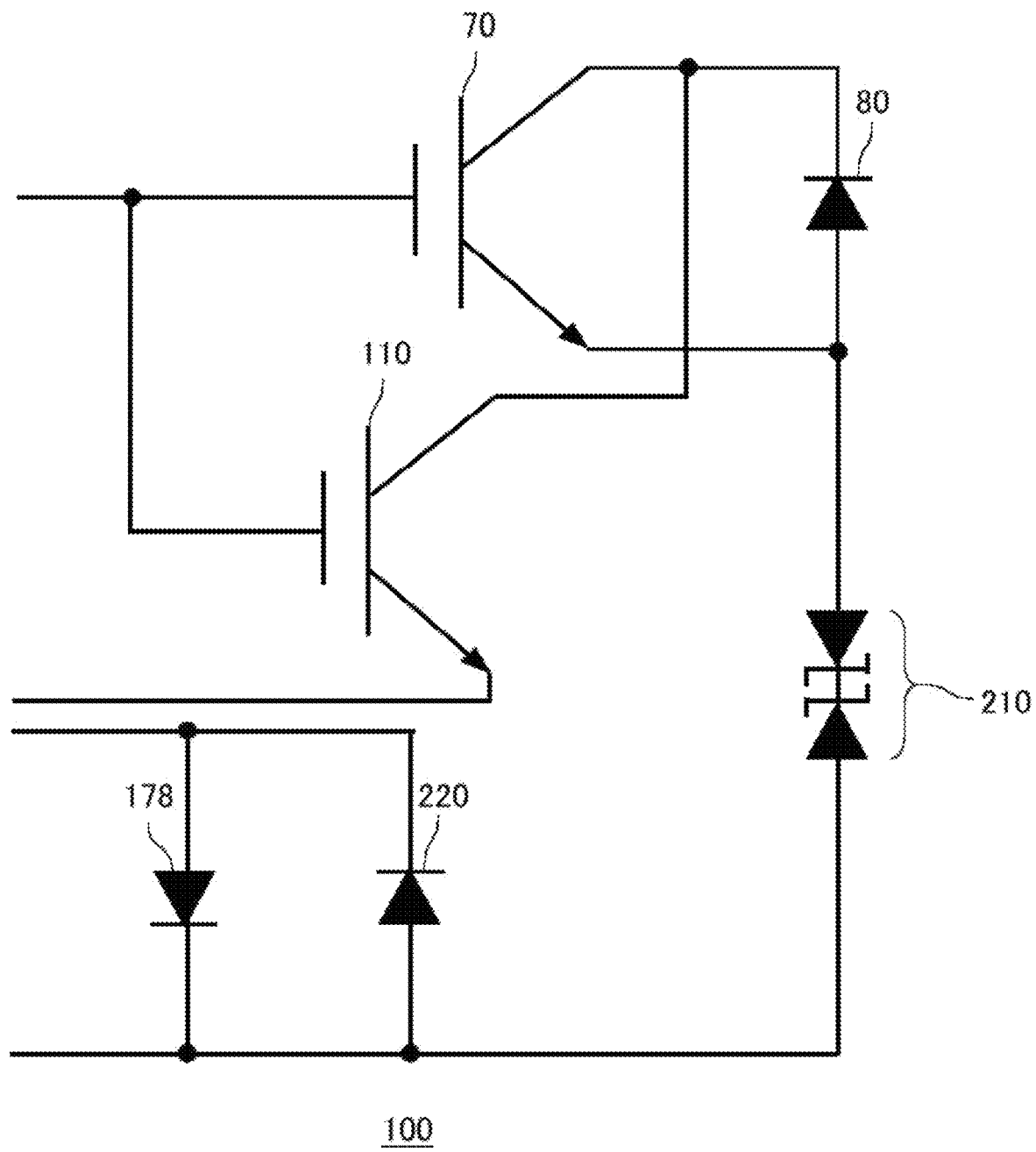
FIG. 8 is one example of an equivalent circuit diagram of the semiconductor device 100.

FIG. 8 is one example of an equivalent circuit diagram of the semiconductor device 100. The semiconductor device 100 of the present example has such structure that a transistor section 70 of which collector is connected to a collector of the current sensing unit 110 that has the same gate potential as the transistor section 70. The transistor section 70 and the diode section 80 of the present example has a RC-IGBT.

The bidirectional diode unit 210 of the present example has one end connected to an emitter of the transistor section 70, and the other end connected to a cathode of the temperature sensing unit 178. The electric connection of the bidirectional diode unit 210 of the present example has no influence on a readout voltage value of the temperature sensing unit 178. In the present example, a circuit symbol of the bidirectional diode unit 210 is illustrated as a Zener diode. However, a diode of the bidirectional diode unit 210 is not limited to the Zener diode.

A protective diode unit 220 is connected in a manner that a diode of the protective diode unit 220 is electrically connected in an antiparallel way to the temperature sensing unit 178. Both ends of the temperature sensing unit 178 may be connected to a circuit having functions of detecting current and voltage of the temperature sensing unit 178, and calculating a temperature.

A wiring between the bidirectional diode unit 210 and the temperature sensing unit 178 shows resistance and self-reactance when implemented in the semiconductor device 100. When a distance between the bidirectional diode unit 210 and the cathode of the temperature sensing unit 178 is long, a time difference may emerge from when electro-static discharge occurs to when Zener operation is performed by the bidirectional diode unit 210.

The semiconductor device 100 of the present example has the bidirectional diode unit 210 arranged between the anode pad 174 and the cathode pad 176, and thereby ensures the Zener operation to be performed quickly. Further, even when a chip of the semiconductor device 100 is downsized upon providing a circuit element on the chip, providing the bidirectional diode unit 210 at this position reduces influence on other elements in a circuit layout. By arranging the bidirectional diode unit 210 and the protective diode unit 220 in this manner of the present example, a protection element of the temperature sensing unit 178 can be arranged away from an active section 120 through which a large current flow. In this manner, ESD withstand capability of the semiconductor device 100 can be improved while circuit reliability is maintained.

Figure 9A:
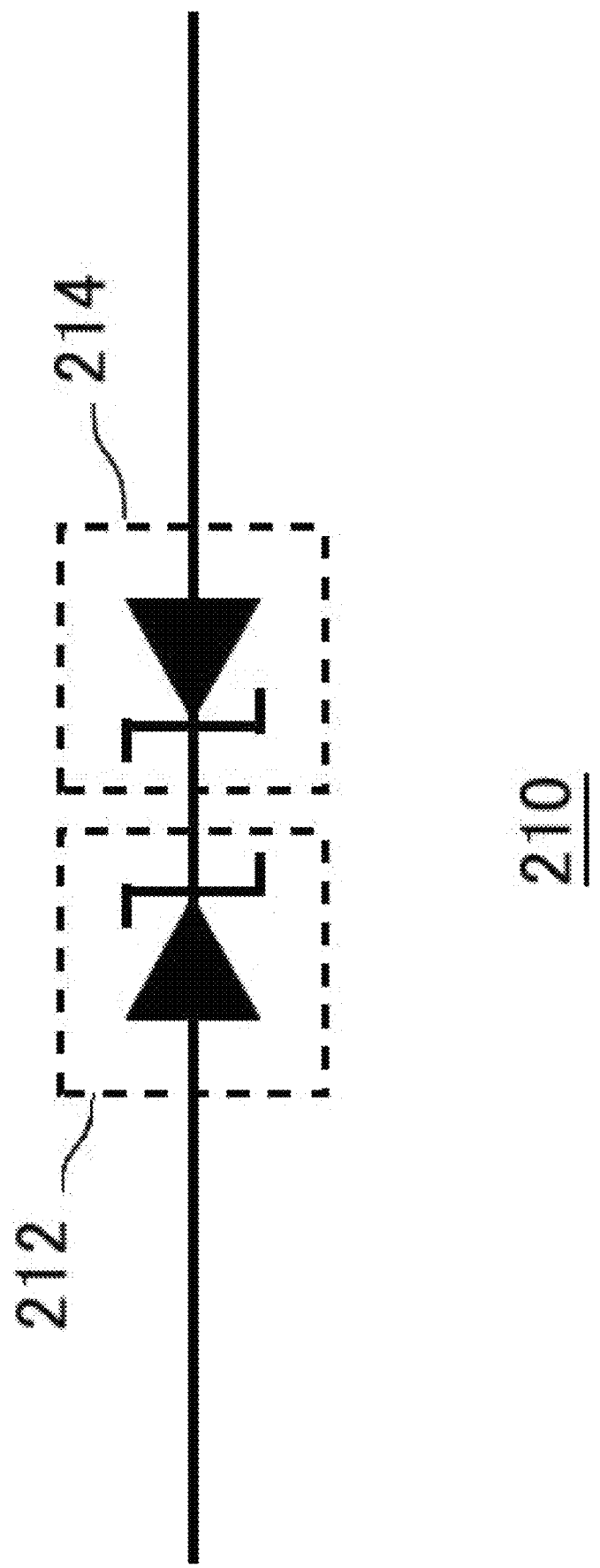
FIG. 9A shows one example of the bidirectional diode unit 210.

FIG. 9A shows one example of the bidirectional diode unit 210. The bidirectional diode unit 210 includes a first diode portion 212 and a second diode portion 214 which are electrically connected in an anti-serial way. Each of the first diode portion 212 and the second diode portion 214 of the present example has a diode. This diode is illustrated with a circuit symbol of a Zener diode in the circuit diagram.

In the bidirectional diode unit 210, each of the first diode portion 212 and the second diode portion 214 has one Zener diode. A cathode of the first diode portion 212 and a cathode of the second diode portion 214 face each other.

Figure 9B:
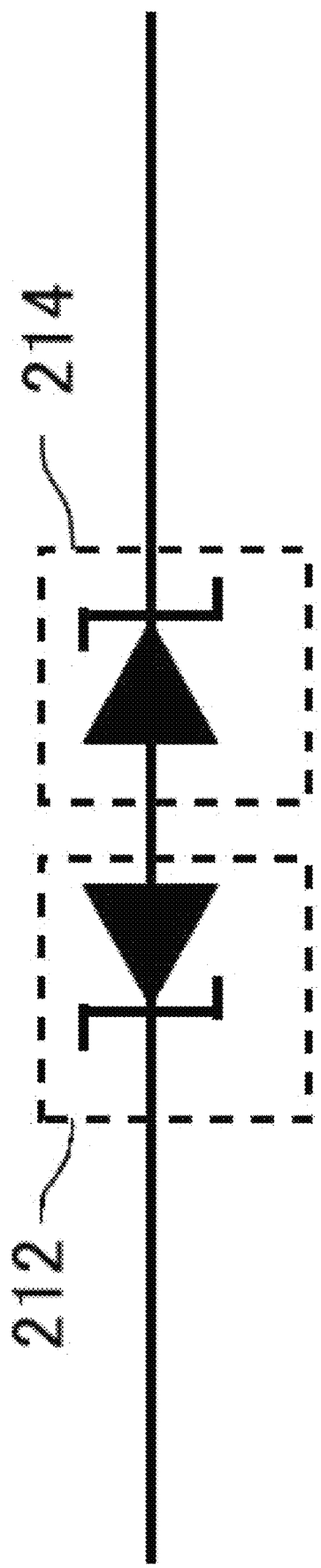
FIG. 9B shows another example of the bidirectional diode unit 210.

FIG. 9B shows another example of the bidirectional diode unit 210. In the bidirectional diode unit 210, an anode of a first diode portion 212 and an anode of a second diode portion 214 face each other. Both of the bidirectional diode units 210 shown in FIG. 9A and FIG. 9B can provide protection against electro-static discharge.

Figure 9C:
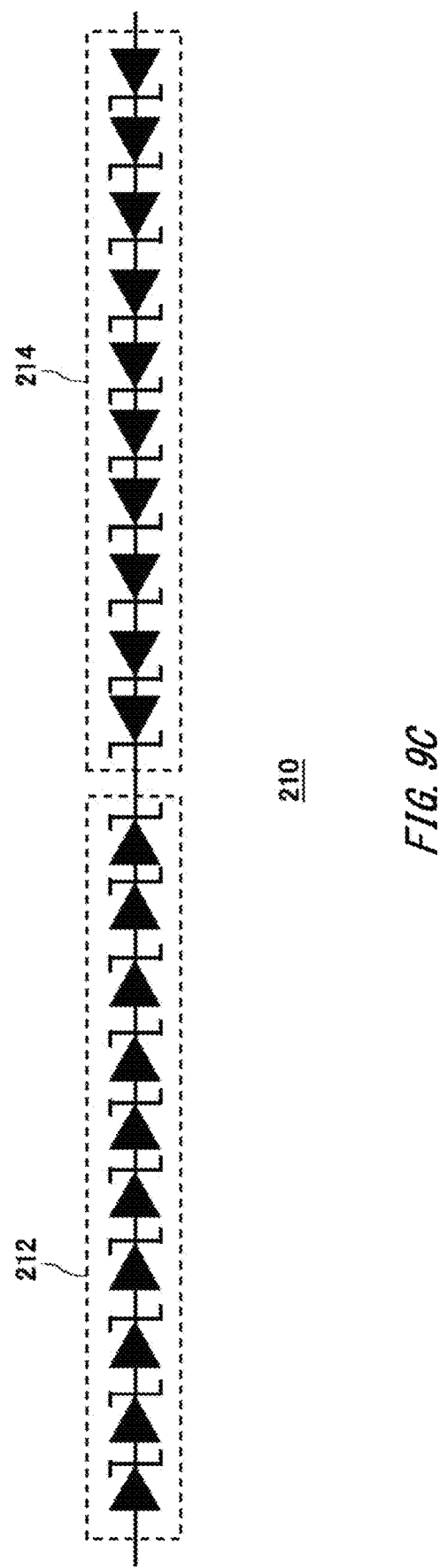
FIG. 9C shows yet another example of the bidirectional diode unit 210.

FIG. 9C shows yet another example of the bidirectional diode unit 210. This bidirectional diode unit 210 has the same configuration as that of the bidirectional diode unit 210 shown in FIG. 4. Each of a first diode portion 212 and a second diode portion 214 has ten Zener diodes. Diodes of the first diode portion 212 and diodes of the second diode portion 214 are electrically connected in series, respectively.

Figure 9D:
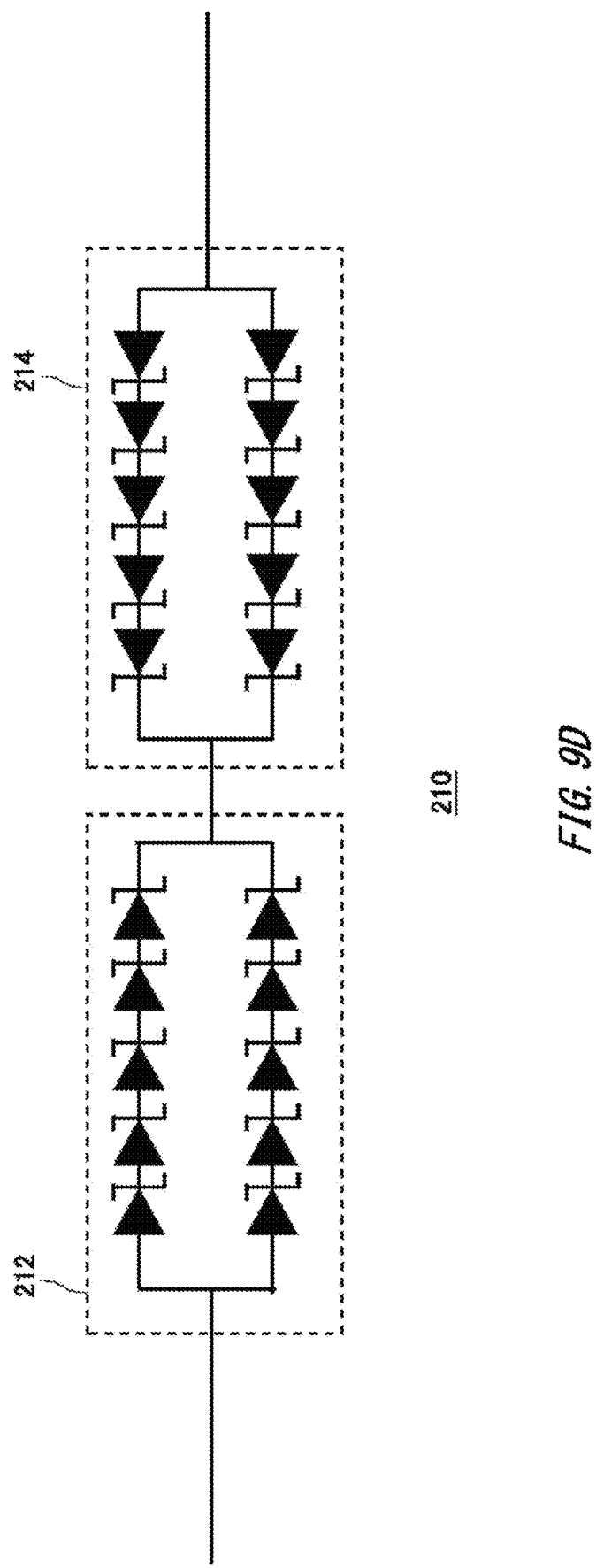
FIG. 9D shows yet another example of the bidirectional diode unit 210.

FIG. 9D shows yet another example of the bidirectional diode unit 210. In this bidirectional diode unit 210, each of a first diode portion 212 and a second diode portion 214 has ten Zener diodes. Each of the first diode portion 212 and the second diode portion 214 has two lines of five diodes, which are connected in parallel. Similar to the present example, each of a first diode portion 212 and a second diode portion 214 may include a plurality of diodes connected in parallel. The first diode portion 212 and the second diode portion 214 may have three or more parallel numbers. Further, more than one diode may be included in each of wirings connected in parallel.

When the bidirectional diode unit 210 of FIG. 9C and the bidirectional diode unit 210 of FIG. 9D are applied with the same voltage, a value of current that flows in the bidirectional diode unit 210 of FIG. 9D is approximately twice as much as a value of current that flows in the bidirectional diode unit 210 of FIG. 9C. When electro-static discharge occurs, current flows in the bidirectional diode unit 210 of FIG. 9D instantaneously faster and easier than in the bidirectional diode unit 210 of FIG. 9C. Accordingly, the bidirectional diode unit 210 of FIG. 9D has ESD withstand capability higher than that of the bidirectional diode unit 210 of FIG. 9C.

FIG. 10A is one example of the P type region and the N type region provided in the bidirectional diode unit 210. The bidirectional diode unit 210 of the present example has the same structure as that of the example of the bidirectional diode unit 210 shown in FIG. 4. The example of the bidirectional diode unit 210 of FIG. 4 is shown together with an equivalent circuit diagram.

Each of a first diode portion 212 and a second diode portion 214 of the bidirectional diode unit 210 of the present example includes a set of ten diodes which are provided in series. A cathode of the first diode portion 212 faces a cathode of the second diode portion 214. The wiring 216 between diffusion regions electrically connects the P type region and the N type region over the interlayer dielectric film 38.

FIG. 10B is another example of the P type region and the N type region provided in the bidirectional diode. This example has the same structure as that of the example of the circuit according to the bidirectional diode unit 210 shown in FIG. 9D. By setting a polarity of a diffusion region and a wiring 216 between diffusion regions, the number of parallel wirings of diodes in the bidirectional diode unit 210 and the number of diodes in each parallel wiring can be adjusted.

In the present example, a parallel number of wirings of a first diode portion 212 is two. In the first diode portion 212, each of the parallel wirings has five diodes. A second diode portion 214 has the same structure as that of the first diode portion 212.

FIG. 10C is yet another example of the P type region and the N type region provided in the bidirectional diode. In a bidirectional diode unit 210 of the present example, each of a first diode portion 212 and a second diode portion 214 has five Zener diodes.

A diode included in the bidirectional diode unit 210 of the present example has a long width in a Y axis direction. Therefore, area of a PN junction region is larger than that of the bidirectional diode unit 210 of FIG. 10A. Accordingly, more current flows in the bidirectional diode unit 210 of the present example than in the bidirectional diode unit 210 according to FIG. 10A. Therefore, the bidirectional diode unit 210 has ESD withstand capability larger than that of the bidirectional diode unit 210 according to FIG. 10A.

Figure 11:
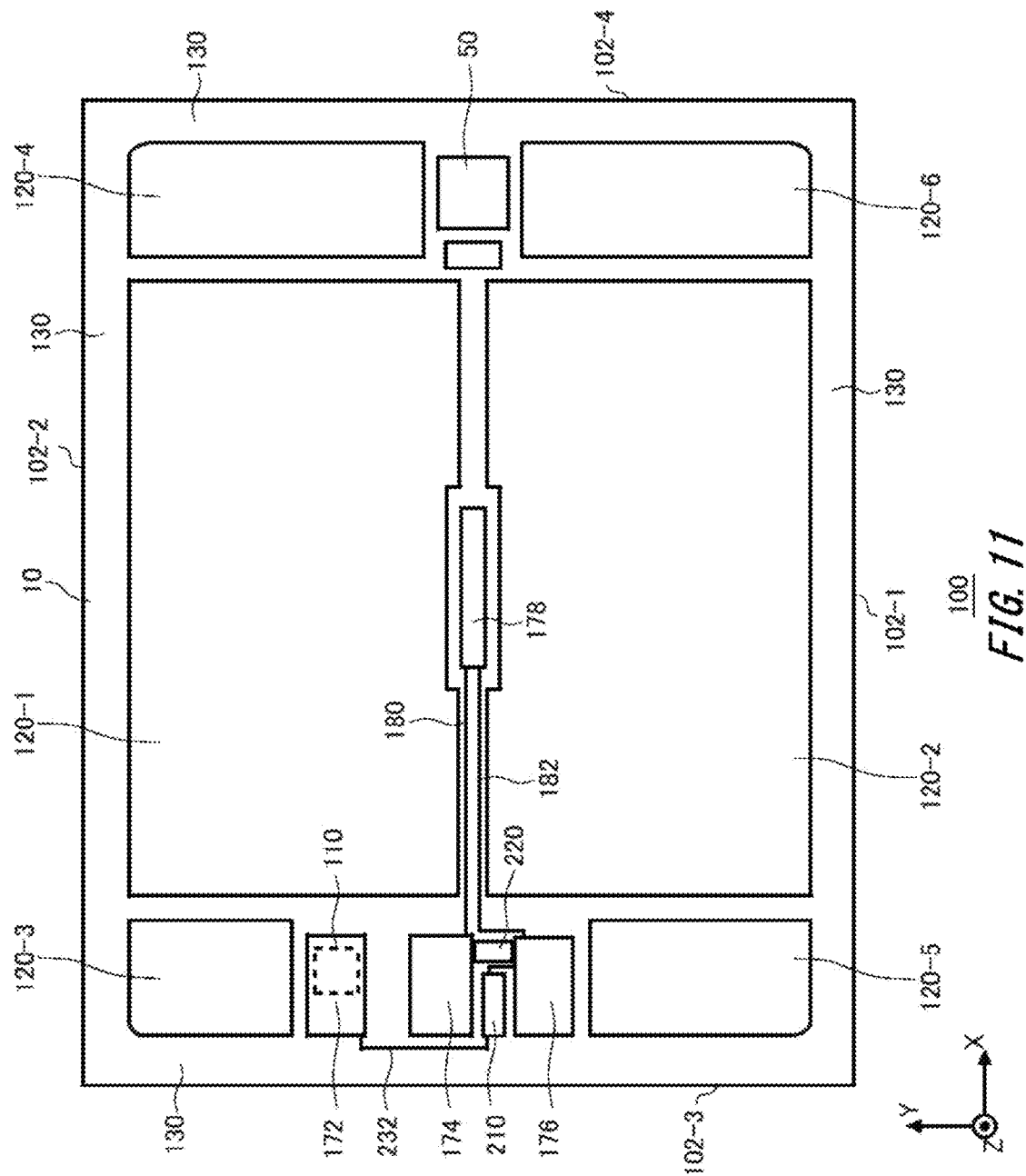
FIG. 11 shows one example of an arrangement of each component on a front surface of a semiconductor device 100 according to Example 2.

FIG. 11 shows one example of an arrangement of each component on a front surface of a semiconductor device 100 according to Example 2. Difference between the present example and Example 1 will be particularly described below.

In the present example, a bidirectional diode unit 210 is electrically connected to a current sensing pad 172 and a cathode pad 176 by a sensing pad wiring 232. In the present example, a front surface electrode to be connected to the bidirectional diode unit 210 corresponds to the current sensing pad 172. That is, the front surface electrode may include the current sensing pad 172 being connected to a current sensing unit 110.

Again, since the bidirectional diode unit 210 of the present example is arranged between an anode pad 174 and the cathode pad 176, the temperature sensing unit 178 is appropriately protected from electro-static discharge, thereby characteristics of the temperature sensing unit 178 can be maintained at a good level. Further, even when a chip of the semiconductor device 100 is downsized, ESD withstand capability of the semiconductor device 100 can be improved while maintaining reliability of a circuit. In the present example, the bidirectional diode unit 210 can provide not only the temperature sensing unit 178 but also the current sensing unit 110 with protection against electro-static discharge.

Figure 12:
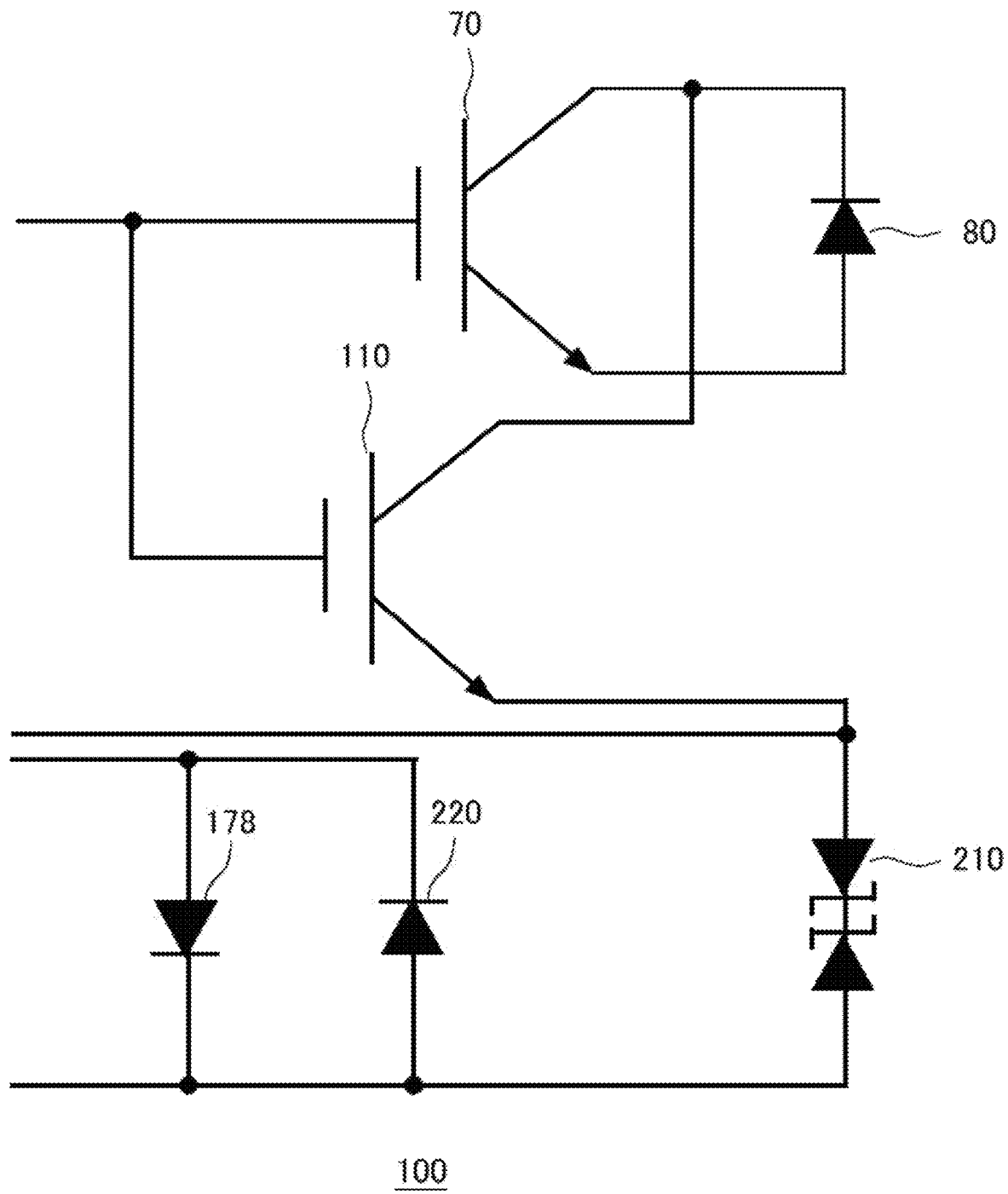
FIG. 12 shows an equivalent circuit diagram of the semiconductor device 100 according to Example 2.

FIG. 12 shows an equivalent circuit diagram of the semiconductor device 100 according to Example 2. The bidirectional diode unit 210 has one end electrically connected to an emitter electrode of the current sensing unit 110, and the other end connected to a cathode of the temperature sensing unit 178.

Figure 13:
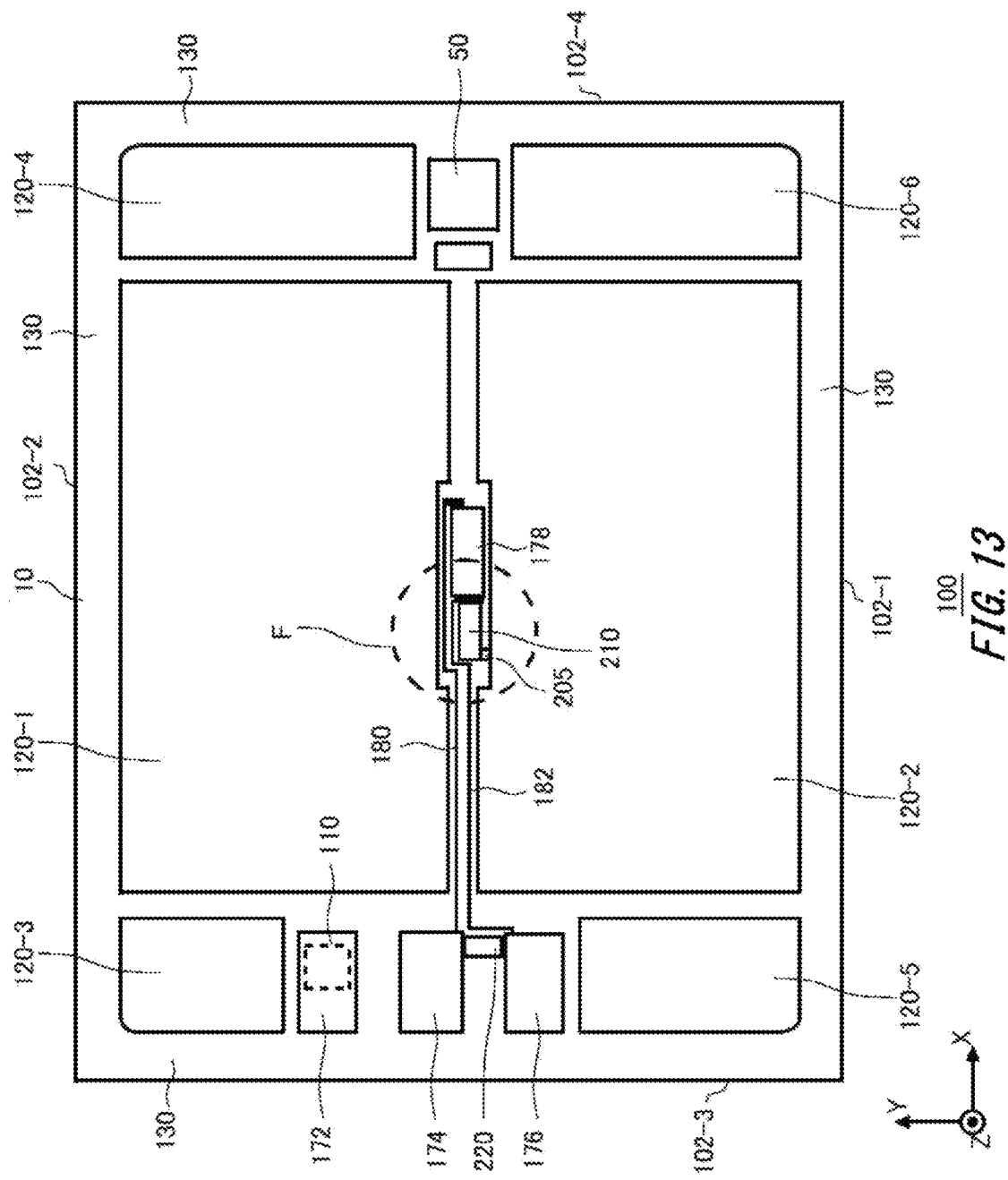
FIG. 13 shows one example of an arrangement of each component on a front surface of a semiconductor device 100 according to Example 3.

FIG. 13 shows one example of an arrangement of each component on a front surface of a semiconductor device 100 according to Example 3. In the present example, a bidirectional diode unit 210 is arranged next to a temperature sensing unit 178 near the center of the semiconductor device 100. The semiconductor device 100 of the present example has the same equivalent circuit as that of Example 1 shown in FIG. 8. The semiconductor device 100 of the present example has the same equivalent circuit as that of Example 1. Difference between the present example and Example 1 will be particularly described with reference to the following enlarged view.

Figure 14:
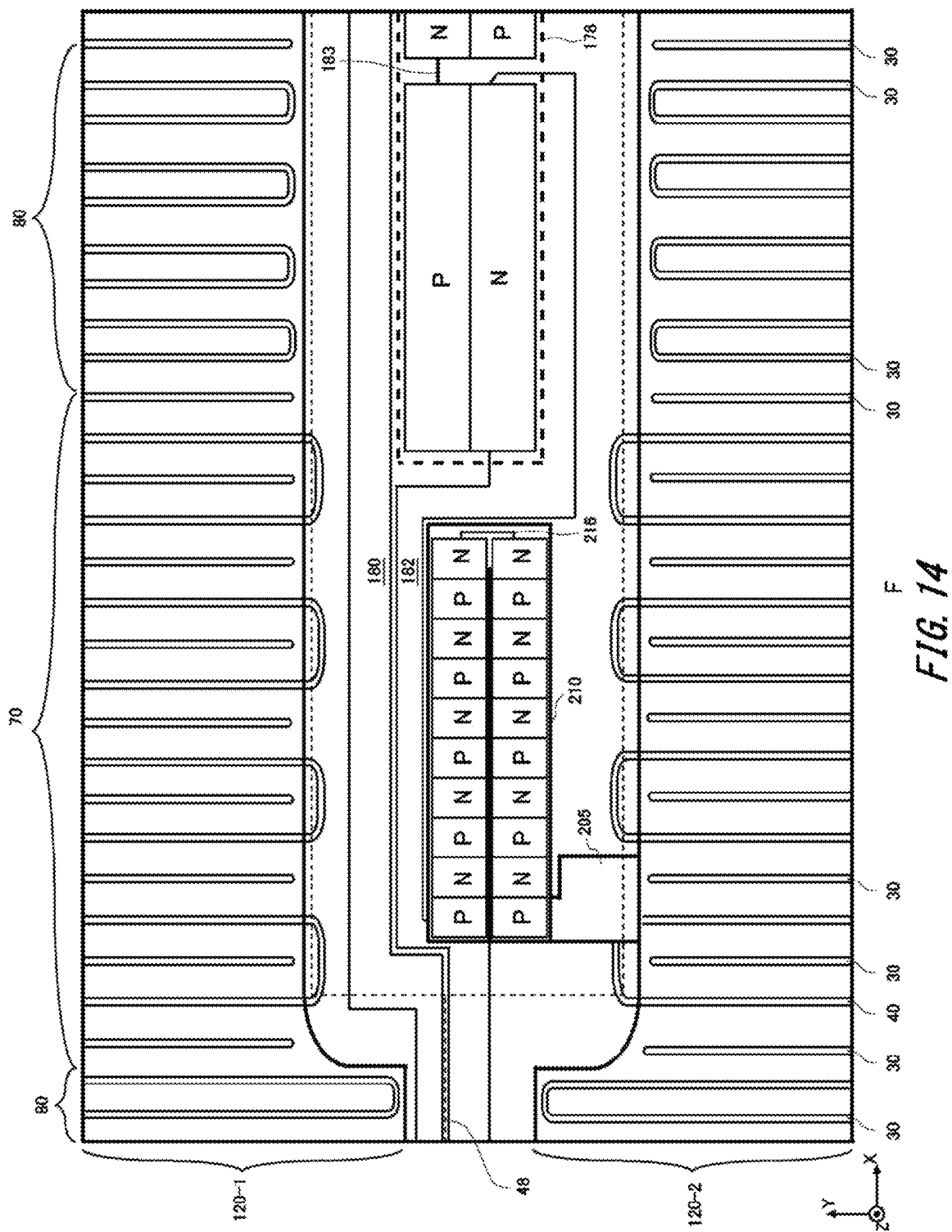
FIG. 14 is one example of an enlarged view in the vicinity of the center of the front surface of the semiconductor device 100 according to Example 3.

FIG. 14 is one example of an enlarged view of near the center of the front surface of the semiconductor device 100 according to Example 3. The present example is one example of an enlarged view of a region F shown in FIG. 13.

The bidirectional diode unit 210 of the present example includes diodes which are electrically connected in a serial bidirectional way between a cathode wiring 182 and an emitter electrode 52 being a front surface electrode. The bidirectional diode unit 210 of the present example is arranged on a front surface of the semiconductor device 100, and between the cathode wiring 182 and the emitter electrode 52 in a Y axis direction. The bidirectional diode unit 210 is arranged such that the cathode wiring 182 is between the bidirectional diode unit 210 and the temperature sensing unit 178 in an X axis direction.

In the present example, the cathode wiring 182 is electrically connected to an N type region on a cathode side of temperature sensing diodes of the temperature sensing unit 178, which are arranged in series. An anode wiring 180 is electrically connected to a P type region on an anode side of the temperature sensing diodes. The cathode wiring 182 and the anode wiring 180 may be curved and extend in a U-shape. Active regions of the temperature sensing unit 178 may be connected by a temperature-sensing wire 183.

The cathode wiring 182 of the present example is also electrically connected to one end of the bidirectional diode unit 210. Another end of the bidirectional diode unit 210 of the present example is electrically connected to a connector 205 extending in a Y axis direction from a transistor section 70 of an active section 120-2.

A gate runner 48 is arranged as illustrated by a dashed line. The gate runner 48 may be connected to a gate conductor 44 of a gate trench 40. A dummy conductor 34 of a dummy trench 30 is connected to the emitter electrode 52 via a contact hole.

A plated layer 230 is provided over an active section 120, and a protective film 92 is provided over a region without the active section 120. In this manner, wirings can be provided without being connected by plating.

According to the arrangement of the present example, the bidirectional diode unit 210 is arranged near the temperature sensing unit 178. An interlayer dielectric film 38 between an active region of the temperature sensing diode and the active section 120 is easily influenced by electro-static discharge. This arrangement of the present example permits the bidirectional diode unit 210 to quickly perform a Zener operation in order to appropriately provide a part of the temperature sensing unit 178, which is subjected to be easily influenced by electro-static discharge, with protection against the electro-static discharge.

Providing the transistor section 70 and a diode section 80 in a rectangular shape in the active section 120 reduces man-hours and cost in manufacturing. When the transistor section 70 and the diode section 80 of a rectangular shape are adopted, and when creating a wide portion for disposing the temperature sensing unit 178 at the center, space is likely to be formed in the vicinity of the temperature sensing unit 178. By virtue of the arrangement of the bidirectional diode unit 210 of the present example, this space in the vicinity of the temperature sensing unit 178 can be effectively utilized. Therefore, in the present example, the semiconductor device 100 with excellent reliability, which supports downsizing of a chip of the semiconductor device 100, can be provided with protection against electro-static.

Figure 15:
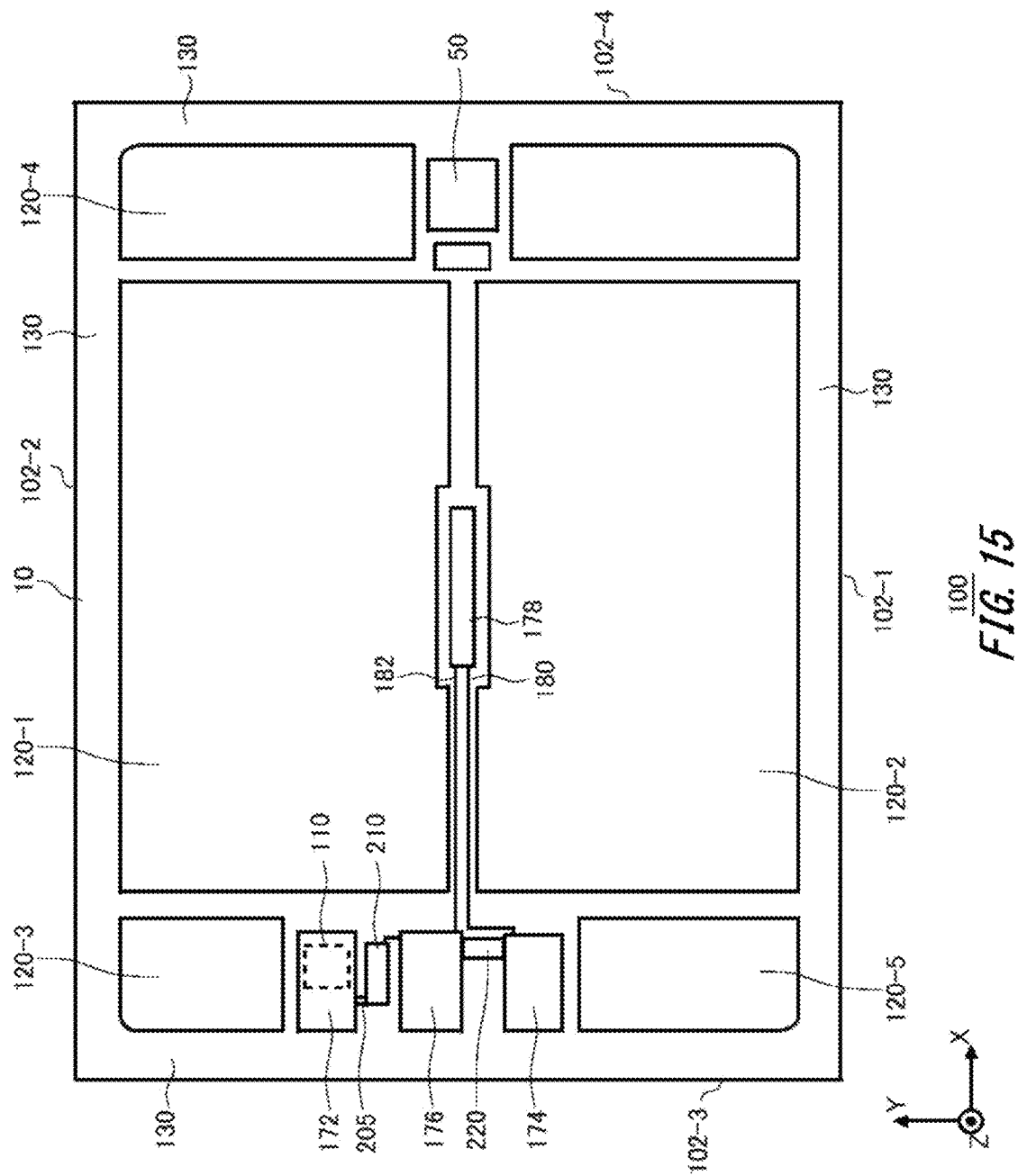
FIG. 15 shows one example of an arrangement of each component on a front surface of the semiconductor device 100 according to Example 4.

FIG. 15 shows one example of an arrangement of each component on a front surface of the semiconductor device 100 according to Example 4. The semiconductor device 100 of the present example has the same equivalent circuit as that of Example 2 shown in FIG. 12. Difference between the present example and Example 2 will be particularly described below.

In the present example, an active region of a temperature sensing unit 178 has an inverse polarity relative to that of Example 4. Therefore, a cathode pad 176 and an anode pad 174 are arranged in reverse order relative to that of Example 4. Note that, exchanging the positions of the cathode pad 176 and the anode pad 174 may be performed by changing positions of an anode wiring 180 and a cathode wiring 182.

In the present example, a bidirectional diode unit 210 is arranged between a current sensing pad 172 and the cathode pad 176 on a front surface of a semiconductor substrate 10. Similar to Example 2, the bidirectional diode unit 210 is electrically connected to the current sensing pad 172 and the cathode pad 176. This may be achieved by means of a connector 205 extending from a front surface electrode of the current sensing pad 172.

An upper surface of the connector 205 is provided with a protective film 92. In this manner, the connector 205 and the bidirectional diode unit 210 are less likely to receive solder from a plated layer. Thereby, stress concentration can be prevented from occurring on the connector 205.

While the embodiments of the present invention have been described, the technical scope of the present invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the present invention.

EXPLANATION OF REFERENCES

10: semiconductor substrate; 12: emitter region; 14: base region; 16: accumulation region; 18: drift region; 20: buffer region; 21: upper surface; 22: collector region; 23: lower surface; 24: collector electrode; 30: dummy trench; 32: dummy insulating film; 34: dummy conductor; 38: interlayer dielectric film; 40: gate trench; 42: gate insulating film; 44: gate conductor; 48: gate runner; 50: gate pad; 52: emitter electrode; 54: contact hole; 60: mesa portion; 70: transistor section; 80: diode section; 82: cathode region; 90: separation part; 92: protective film; 94: extending portion; 100: semiconductor device; 102: edge; 110: current sensing unit; 120: active section; 130: well region; 172: current sensing pad; 174: anode pad; 176: cathode pad; 178: temperature sensing unit; 180: anode wiring; 182: cathode wiring; 183: temperature-sensing wire; 203: main metal portion; 205: connector; 210: bidirectional diode unit; 212: first diode portion; 214: second diode portion; 216: wiring between diffusion regions; 220: protective diode unit; 230: plated layer; 232: sensing pad wiring

What is claimed is:

1. A semiconductor device, comprising:
a semiconductor substrate;
a temperature sensing unit provided on a front surface of the semiconductor substrate;
an anode pad and a cathode pad electrically connected to the temperature sensing unit;
a front surface electrode being set to a predetermined reference potential; and
a bidirectional diode unit electrically connected in a serial bidirectional way between the cathode pad and the front surface electrode, wherein
the bidirectional diode unit is arranged between the anode pad and the cathode pad on the front surface, and
the bidirectional diode unit has a first diode portion and a second diode portion connected in an anti-serial way to the first diode portion.

2. The semiconductor device according to claim 1, wherein the bidirectional diode unit includes a Zener diode connected in a bidirectional way.

3. The semiconductor device according to claim 2, wherein the front surface electrode includes,
a main metal portion provided on the front surface, and
a connector for connecting the main metal portion and the bidirectional diode unit.

4. The semiconductor device according to claim 2, wherein
each of the first diode portion and the second diode portion includes a plurality of diodes connected in parallel.

5. The semiconductor device according to claim 1, wherein the front surface electrode includes,
a main metal portion provided on the front surface, and
a connector for connecting the main metal portion and the bidirectional diode unit.

6. The semiconductor device according to claim 5, comprising:
- a transistor section electrically connected to the front surface electrode; and
- a gate runner being provided on a front surface of the semiconductor substrate and electrically connected to a gate electrode of the transistor section, wherein
- the connector crosses over the gate runner.

7. The semiconductor device according to claim 6, further comprising a current sensing unit, wherein
- the front surface electrode includes a current sensing pad electrically connected to the current sensing unit.

8. The semiconductor device according to claim 7, comprising a protective film provided above the connector.

9. The semiconductor device according to claim 7, wherein
- each of the first diode portion and the second diode portion includes a plurality of diodes connected in parallel.

10. The semiconductor device according to claim 6, comprising a protective film provided above the connector.

11. The semiconductor device according to claim 6, wherein
- each of the first diode portion and the second diode portion includes a plurality of diodes connected in parallel.

12. The semiconductor device according to claim 5, comprising a protective film provided above the connector.

13. The semiconductor device according to claim 12, wherein the protective film contains polyimide.

14. The semiconductor device according to claim 13, wherein
- the protective film has an extending portion extending in a predetermined direction on the front surface of the semiconductor substrate, and
- the bidirectional diode unit is arranged closer to a periphery of the front surface of the semiconductor substrate than the extending portion.

15. The semiconductor device according to claim 12, wherein
- the protective film has an extending portion extending in a predetermined direction on the front surface of the semiconductor substrate, and
- the bidirectional diode unit is arranged closer to a periphery of the front surface of the semiconductor substrate than the extending portion.

16. The semiconductor device according to claim 5, wherein
- each of the first diode portion and the second diode portion includes a plurality of diodes connected in parallel.

17. The semiconductor device according to claim 1, wherein
- each of the first diode portion and the second diode portion includes a plurality of diodes connected in parallel.

18. A semiconductor device, comprising:
- a semiconductor substrate;
- a temperature sensing unit provided on a front surface of the semiconductor substrate;
- an anode wiring and a cathode wiring electrically connected to the temperature sensing unit;
- a front surface electrode being set to a predetermined reference potential; and
- a bidirectional diode unit electrically connected in a serial bidirectional way between the cathode wiring and the front surface electrode, wherein
  - the bidirectional diode unit is arranged between the cathode wiring and the front surface electrode on the front surface, and
  - the bidirectional diode unit has a first diode portion and a second diode portion connected in an anti-serial way to the first diode portion.

19. The semiconductor device according to claim 18, wherein the bidirectional diode unit is arranged so that the cathode wiring is between the bidirectional diode unit and the temperature sensing unit.

20. A semiconductor device, comprising:
- a semiconductor substrate;
- a temperature sensing unit provided on a front surface of the semiconductor substrate;
- an anode pad and a cathode pad electrically connected to the temperature sensing unit;
- a current sensing unit;
- a current sensing pad being set to a predetermined reference potential and electrically connected to the current sensing unit; and
- a bidirectional diode unit electrically connected in a serial bidirectional way between the cathode pad and the current sensing pad, wherein
  - the bidirectional diode unit is arranged between the current sensing pad and the cathode pad on the front surface, and
  - the bidirectional diode unit has a first diode portion and a second diode portion connected in an anti-serial way to the first diode portion.

\* \* \* \* \*